(12) United States Patent
Bussan

(10) Patent No.: US 10,809,096 B2
(45) Date of Patent: Oct. 20, 2020

(54) DIFFERENTIAL HALL MAGNET POLARITY DETECTION FOR AMR 360 DEGREE SENSOR

(71) Applicant: Honeywell International Inc., Morris Plains, NJ (US)

(72) Inventor: Anthony J. Bussan, Davis Junction, IL (US)

(73) Assignee: Honeywell International Inc., Morristown, NJ (US)

(*) Notice: Subject to any disclaimer, the term of this patent is extended or adjusted under 35 U.S.C. 154(b) by 261 days.

(21) Appl. No.: 15/772,616

(22) PCT Filed: Nov. 2, 2015

(86) PCT No.: PCT/US2015/058566
§ 371 (c)(1),
(2) Date: May 1, 2018

(87) PCT Pub. No.: WO2017/078665
PCT Pub. Date: May 11, 2017

(65) Prior Publication Data
US 2019/0120659 A1    Apr. 25, 2019

(51) Int. Cl.
*G01D 5/16* (2006.01)
*G01R 33/07* (2006.01)
*G01D 5/14* (2006.01)

(52) U.S. Cl.
CPC .............. *G01D 5/16* (2013.01); *G01D 5/145* (2013.01); *G01R 33/07* (2013.01)

(58) Field of Classification Search
CPC .......... G01D 5/16; G01D 5/145; G01R 33/07; G01R 33/0094; G01N 35/10
See application file for complete search history.

(56) References Cited

U.S. PATENT DOCUMENTS

| 3,419,798 A | 12/1968 | Walton |
| 5,241,267 A | 8/1993 | Gleixner et al. |
| 5,444,369 A | 8/1995 | Luetzow |

(Continued)

FOREIGN PATENT DOCUMENTS

| CN | 103389479 A | 11/2013 |
| CN | 104011507 A | 8/2014 |

(Continued)

OTHER PUBLICATIONS

U.S. Appl. No. 13/037,950, Restriction Requirement, dated Jan. 16, 2014, 7 pages.

(Continued)

*Primary Examiner* — Christopher P McAndrew
*Assistant Examiner* — Zannatul Ferdous
(74) *Attorney, Agent, or Firm* — Alston & Bird LLP

(57) ABSTRACT

A device comprises a magnetoresistive sensor configured to generate a signal indicative of an angular position of a magnetic field, the signal having an angular range of 180 degrees, and a differential Hall sensor pair comprising a first Hall sensor and a second Hall sensor. The differential Hall sensor pair is configured to generate a signal indicative of a polarity of the magnetic field. A second differential Hall sensor pair can also be used. The second differential Hall sensor pair is configured to generate a signal indicative of a polarity of the magnetic field.

20 Claims, 10 Drawing Sheets

(56) References Cited

U.S. PATENT DOCUMENTS

| | | | |
|---|---|---|---|
| 5,568,048 | A | 10/1996 | Schroeder et al. |
| 6,104,185 | A | 8/2000 | Lamm et al. |
| 6,212,783 | B1 | 4/2001 | Ott et al. |
| 6,707,293 | B2 | 3/2004 | Wan et al. |
| 9,041,387 | B2 | 5/2015 | Holman, Jr. et al. |
| 2002/0089327 | A1 | 7/2002 | Spellman |
| 2003/0128026 | A1 | 7/2003 | Lutz |
| 2007/0200564 | A1 | 8/2007 | Motz et al. |
| 2008/0116888 | A1* | 5/2008 | Lee .................. G01C 17/30 324/247 |
| 2008/0121831 | A1 | 5/2008 | Ikeda |
| 2009/0045807 | A1* | 2/2009 | Nishida ............ G01D 5/145 324/207.2 |
| 2011/0246133 | A1 | 10/2011 | Harada et al. |
| 2012/0223699 | A1* | 9/2012 | Holman, Jr. ...... G01D 5/145 324/207.2 |
| 2013/0015845 | A1* | 1/2013 | Fox ................. G01R 33/091 324/207.21 |
| 2016/0327411 | A1* | 11/2016 | Kobayashi ........ G01D 5/2457 |

FOREIGN PATENT DOCUMENTS

| | | |
|---|---|---|
| CN | 104931075 A | 9/2015 |
| CN | 102654567 B | 4/2017 |
| CN | 108474669 A | 8/2018 |
| DE | 3446049 A1 | 6/1986 |
| DE | 197220106 A1 | 12/1998 |
| DE | 19928482 A1 | 12/2000 |
| DE | 10017061 A1 | 10/2001 |
| DE | 10248060 A1 | 5/2004 |
| DE | 102004050586 A1 | 4/2006 |
| EP | 0175831 A2 | 4/1986 |
| EP | 1870677 A2 | 12/2007 |
| EP | 2495536 A2 | 9/2012 |
| EP | 2495536 B1 | 6/2017 |
| EP | 3371552 A1 | 9/2018 |
| FR | 2379106 A2 | 8/1978 |
| JP | 5927220 A | 2/1984 |
| WO | 2013063205 A1 | 5/2013 |
| WO | 2017078665 A1 | 5/2017 |

OTHER PUBLICATIONS

U.S. Appl. No. 13/037,950, Office Action, dated Apr. 15, 2014, 11 pages.
U.S. Appl. No. 13/037,950, Final Office Action, dated Nov. 17, 2014, 13 pages.
U.S. Appl. No. 13/037,950, Notice of Allowance, dated Jan. 27, 2015, 10 pages.
Application Sheet, "Flow to Apply Honeywell APS00B AMR Sensors," downloaded from https://sensing.honeywell.com/index.cfm/ci_id_158863/la_id/1/document/re_id/0, 7 pages, downloaded on Feb. 28, 2011.
China Patent Application No. 201210119991.6, Office Action, dated Aug. 5, 2015, 16 pages.
China Patent Application No. 201210119991.6, Office Action, dated Apr. 26, 2016, 7 pages.
China Patent Application No. 201210119991.6, Office Action, dated Sep. 28, 2016, 9 pages.
China Patent Application No. 201210119991.6, Notification to Grant Patent Rigt, dated Jan. 20, 2017, 3 pages.
International Application No. PCT/US2015/058566, International Preliminary Report on Patentability, dated May 17, 2018, 8 pages.
International Application No. PCT/US2015/058566, International Search Report, dated Jul. 29, 2016, 4 pages.
International Application No. PCT/US2015/058566, Written Opinion of the International Searching Authority, dated Jul. 29, 2016, 6 pages.
"Applications of Magnetic Position Sensors," Solid State Electronics Center, downloaded from https://aerocontent.honeywell.com/aero/common/documents/Applications-of-Magnetic-Position-Sensors.pdf, 8 pages, downloaded on Apr. 30, 2018.
Magnetoresistive Sensors, "Industry: Position and Solid State Sensing" downloaded from https://sensing.honeywell.com/index.php?ci_id=50272, 3 pages, downloaded on Apr. 30, 2018.
Europe Patent Application No. 12157558.3, Extended European Search Report, dated Jun. 23, 2014, 3 pages.
Europe Patent Application No. 12157558.3, Examination Report, dated Aug. 14 2014, 4 pages.
Europe Patent Application No. 12157558.3, Examination Report, dated Sep. 28, 2015, 4 pages.
Europe Patent Application No. 12157558.3, Examination Report, dated May 31, 2016, 4 pages.
Europe Patent Application No. 12157558.3, Intention to Grant, dated Jan. 30, 2017, 75 pages.
Europe Patent Application No. 12157558.3, Decision to Grant, dated May 18, 2017, 2 pages.
Application Sheet, "How to Apply Honeywell APS00B AMR Sensors," downloaded from https://sensing.honeywell.com/index.cfm/ci_id_158863/la_id/1/document/re_id/0, 7 pages, downloaded on Feb. 28, 2011.
Europe Patent Application No. 15791884.8, Communication pursuant to Rules 161(1) and 162 EPC, dated Jun. 8, 2018, 3 pages.
Chinese Office Action for related Chinese Application No. 201580085638.2 dated Mar. 16, 2020, 21 pages.
Chinese Office Action for related Chinese Application No. 201580085638.2 dated Mar. 16, 2020, 11 pages [Partial Translation].
Decision to Grant for related European Application No. 15791884.8 dated Jan. 10, 2020, 2 pages.
Examination Report for related European Application No. 15791884.8 dated Mar. 19, 2019, 4 pages.
Hao, Shuang-hui, "Design of absolute multi-pole shaft encoders", Optics and Precision Engineering, vol. 18, No. 4 (Apr. 30, 2010), 9 pages [Partial Translation].
Intention to Grant for related European Application No. 15791884.8 dated Aug. 5, 2019, 8 pages.
Intention to Grant for related European Application No. 15791884.8 dated Dec. 19, 2019, 6 pages.

* cited by examiner

DIFFERENTIAL HALL MAGNET POLARITY DETECTION FOR AMR 360 DEGREE SENSOR

CROSS-REFERENCE TO RELATED APPLICATIONS

The present application is the National Stage of International Application No. PCT/US2015/058566 filed on Nov. 2, 2015 and entitled "Differential Hall Magnet Polarity Detection For AMR 360 Degree Sensors" which is incorporated herein by reference as if reproduced in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Magnetic position sensing involves the use of a magnetic sensor to provide an indication of the angular position of a rotatable magnetic field. One existing type of magnetic field sensor is an anisotropic magnetoresistive (AMR) sensor. An AMR sensor may include resistive elements that are configured into one or more Wheatstone bridge configurations. Each of the resistive elements may have a resistance that varies according to the magnitude and/or direction of a magnetic field that is incident upon the respective resistive element. The Wheatstone bridge configuration may generate an output voltage value that is indicative of the change in resistance caused by the amplitude and direction of the magnetic field.

Some types of AMR devices are configured to generate a unique output voltage value for rotational angles of an incident magnetic field within a range of 180 degrees. For example, an AMR device may include two Wheatstone bridge configurations oriented 45 degrees in rotation from each other. The resistive elements within the Wheatstone bridge configurations may be formed from Permalloy material. In such examples, the resistance of each of the resistive elements may vary according to a $\cos^2(\theta)$ relationship, where $\theta$ is the angle between the magnetic moment vector of the resistive element and the current flowing through the resistive element. Such an AMR device may be able to produce a first output voltage that varies according to a $\sin(2\theta)$ relationship and a second output voltage that varies according to a $\cos(2\theta)$ relationship. The first and second output voltages may be used to determine an angular position of a magnetic field incident on the AMR device. Because the $\sin(2\theta)$ function and the $\cos(2\theta)$ function are periodic functions each with a period of 180 degrees, such an AMR device is not able to provide a unique output voltage value for each rotational angle of an incident magnetic field within a range of 360 degrees.

SUMMARY

In an embodiment, a device comprises a magnetoresistive sensor configured to generate a signal indicative of an angular position of a magnetic field, the signal having an angular range of 180 degrees, and a differential Hall sensor pair comprising a first Hall sensor and a second Hall sensor. The differential Hall sensor pair is configured to generate a signal indicative of a polarity of the magnetic field. A second differential Hall sensor pair can also be used. The second differential Hall sensor pair is configured to generate a signal indicative of a polarity of the magnetic field. The second differential Hall sensor pair can comprise at least one of the first Hall sensor or the second Hall sensor, and a third Hall sensor. The second differential Hall sensor pair can comprise a third Hall sensor and a fourth Hall sensor. A Hall sensor sensing plane can be defined as a plane that includes the differential Hall sensor pair and the second differential Hall sensor pair, and the Hall sensor sensing plane can be perpendicular to the axis of rotation of the magnetic field. The differential Hall sensor pair and the second differential Hall sensor pair can be positioned such that a measurement of an angle formed between a first line connecting the sensors forming the differential Hall sensor pair and a second line connecting the sensors forming the second differential Hall sensor pair is approximately equal to 90 degrees. The device can also include a decoder configured to generate a decoded signal indicative of the angular position of the magnetic field based on the first signal indicative of the angular position of the magnetic field, and the signal indicative of the polarity of the magnetic field sensed by the differential Hall sensor pair, the decoded signal having an angular range of 360 degrees. The decoder can comprise an analog decoder. The differential Hall sensor pair and the second differential Hall sensor pair can be positioned in a quadrature configuration with respect to an axis of rotation of the magnetic field. The signal indicative of the angular position of the magnetic field can comprise one or more signals that vary sinusoidally with respect to the angular position of the magnetic field. The magnetoresistive sensor, the first Hall sensor, and the second Hall sensor can each be attached to a planar substrate. The magnetoresistive sensor can be configured to sense components of the magnetic field that are coplanar with the planar substrate. The first Hall sensor can be configured to sense components of the magnetic field that are perpendicular to the planar substrate, and the second Hall sensor can be configured to sense components of the magnetic field that are perpendicular to the planar substrate. The differential Hall sensor pair can be configured to produce an output comprising the difference in an output of the first Hall sensor and the second Hall sensor.

In an embodiment, a method comprises generating, with a magnetoresistive sensor, a signal indicative of an angular position of a magnetic field, the signal having an angular range of 180 degrees, and generating a signal indicative of a polarity of the magnetic field using a differential Hall sensor pair. The differential Hall sensor pair comprises a first Hall sensor and a second Hall sensor. The method can also include generating a second signal indicative of a polarity of the magnetic field using a second differential Hall sensor pair, where the second differential Hall sensor pair comprises a third Hall sensor and a fourth Hall sensor. The third Hall sensor can be the same as the first Hall sensor or the second Hall sensor. The method can also include generating a decoded signal indicative of the angular position of the magnetic field based on the first signal indicative of the angular position of the magnetic field, the signal indicative of the polarity of the magnetic field, and the second signal indicative of the polarity of the magnetic field, the decoded signal having an angular range of 360 degrees. The signal indicative of the angular position of a magnetic field can comprise a first sinusoidal signal and a second sinusoidal signal, and the method can also include applying a first transfer function to the first sinusoidal signal and the second sinusoidal signal to produce a first candidate intermediate signal, applying a second transfer function to the first sinusoidal signal and the second sinusoidal signal to produce a second candidate intermediate signal, selecting one of the first candidate intermediate signal and the second candidate intermediate signal as the intermediate signal based on the signal indicative of the polarity of the magnetic field and the second signal indicative of the polarity of the magnetic field, selecting an offset value from a set of offset values based on the signal indicative of the polarity of the magnetic field and the second signal indicative of the polarity of the magnetic field, and adding the selected offset to the intermediate value to generate the decoded signal indicative of the angular position of the magnetic field.

In an embodiment, a device comprises a magnetoresistive sensor configured to generate a signal indicative of an angular position of a magnetic field, the signal having an angular range of 180 degrees, a first differential polarity sensor configured to generate a first signal indicative of a polarity of the magnetic field, and a second differential polarity sensor configured to generate a second signal indicative of a polarity of the magnetic field. The device can also include a decoder configured to generate a decoded signal indicative of the angular position of the magnetic field based on the signal indicative of the angular position of the magnetic field, the first signal indicative of the polarity of the magnetic field, and the second signal indicative of the polarity of the magnetic field, the decoded signal having an angular range of 360 degrees. The first differential polarity sensor can comprise a first Hall sensor and a second Hall sensor, and the second differential polarity sensor can comprise a third Hall sensor and a fourth Hall sensor. The second Hall sensor and the third Hall sensor can be the same sensor. An axis of rotation of the magnetic field and an axis of rotation of the device can be out of alignment.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
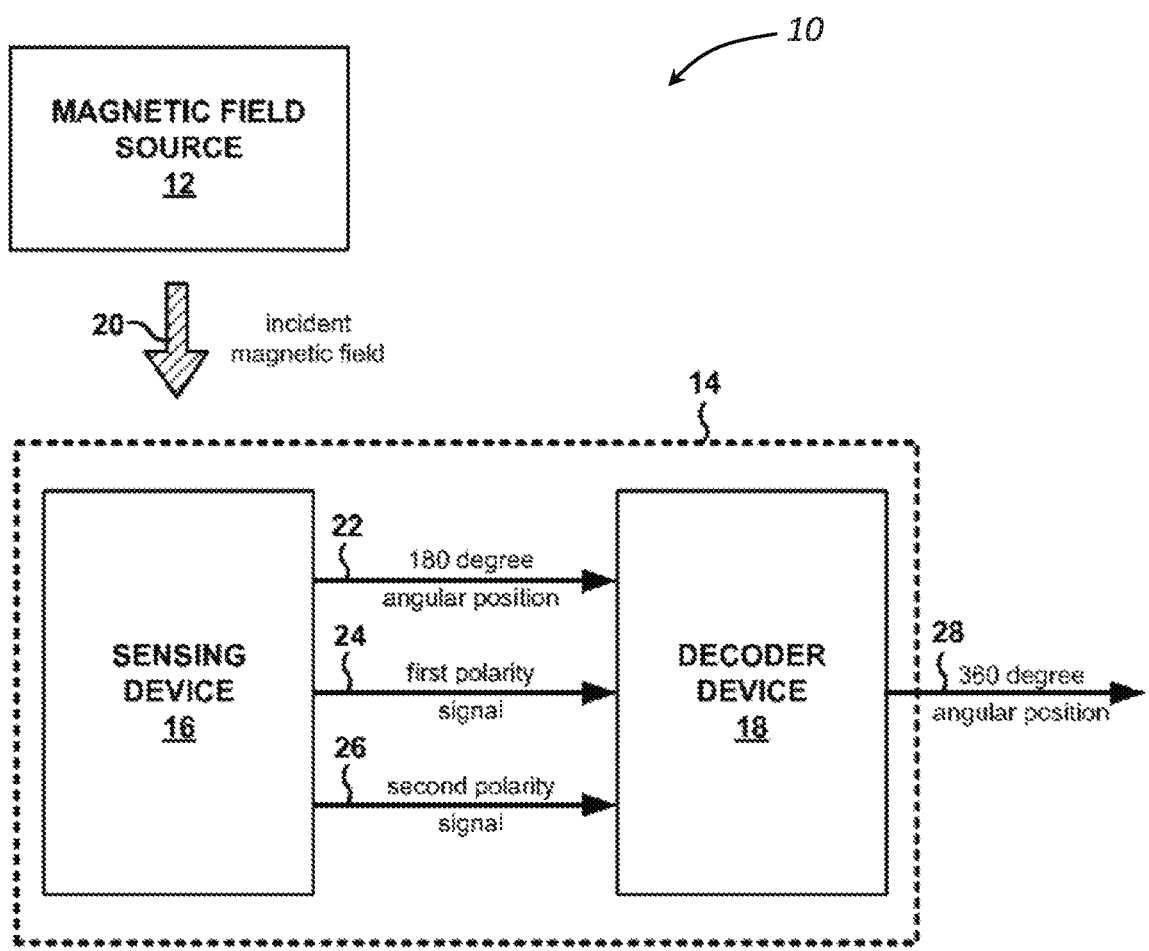
FIG. 1 is a block diagram illustrating an embodiment of a magnetic field angular position sensing system according to this disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

This disclosure is directed to techniques for magnetic field angular position sensing. The techniques may involve the use of a magnetic field angular position sensor and two or more polarity detectors. The magnetic field angular position sensor may be configured to generate a first signal indicative of the angular position of an incident magnetic field. The two or more polarity detectors may be positioned in at least two different locations to generate signals indicative of the polarity of the incident magnetic field at each of the two different locations. The signals generated by the polarity detectors may be used in combination with the first signal generated by the magnetic field angular position sensor to generate a second signal indicative of the angular position of the incident magnetic field. The second signal indicative of the angular position of the incident magnetic field may have an angular range that is greater than that of the first signal indicative of the angular position of the incident magnetic field. In this manner, the techniques of this disclosure may provide an angular position sensing signal with an increased angular range relative to that which is generated by the magnetic field angular position sensor itself.

In some embodiments, the polarity detectors can each include a differential Hall sensor pair. The differential Hall sensor pairs use a combination of two Hall sensors (referred to simply as Hall sensors herein), where the output from the two sensors are subtracted from each other to determine a differential magnetic field between the two sensors. The signal produced from the differential Hall sensor pairs is indicative of the slope of the magnetic field along an axis between the two sensors in the pair. In the absence of a changing field or a differential field across the pair, the output from the sensor pair is effectively zero. As the sensors in the differential Hall sensor pair move through a rotating magnetic field, the slope of the change of the magnetic field changes from positive, to zero, to negative. The resulting output can be used with a logical state comparator to determine the magnetic sector polarity. As compared to the use of a single Hall sensor for each of the polarity detectors, the use of a differential Hall sensor pair provides the desired output signal over a broader range of misalignment with the magnetic field, which may allow for a broader range of applicability of the rotational sensors.

An anisotropic magnetoresistive (AMR) sensor that includes two Wheatstone bridge configurations oriented 45 degrees in rotation from each other may provide magnetic field angular position sensing of an incident magnetic field within a measurement range of 180 degrees. For some types of angular position sensing applications, it may be desirable to have an angular measurement range of 360 degrees rather than 180 degrees. For example, it may be desirable to provide a 360 degree angular measurement range when sensing the angular position of a rotating shaft, such as, e.g., a steering wheel.

For applications where a 360 degree angular measurement range is desired, the 180 degree angular measurement range provided by the AMR sensor described above may not be sufficient to discriminate the angular position of the incident magnetic field. For example, an output value produced by the AMR sensor that corresponds to 30 degrees within a 180 degree angular measurement range may correspond to either 30 degrees or 210 degrees within a 360 degree angular measurement range. Thus, such a sensor is not able to discriminate in which half of a 360 angular spectrum the incident magnetic field is positioned.

One solution to this problem is to use a Hall sensor to sense the polarity of the incident magnetic field. The Hall sensor may be positioned in a location where the incident magnetic field includes directional components that are perpendicular to the plane of rotation of the source magnet that generates the incident magnetic field. When positioned in such a manner, the Hall sensor may provide information as to which half-spectrum of the 360 degree angular spectrum the incident magnetic field is positioned. This information may be used in conjunction with the output value of the AMR sensor to determine an output value corresponding to a 360 angular position.

Due to magnetic parameter variations, such as operate and release variations in the Hall sensor, the transition angles between the first half-phase and the second half-phase of the 360 degree angular spectrum may vary within a transition range. For example, if it is assumed that the first half-phase is defined to include all angles, θ, for 0≤θ<180 degrees and the second half-phase is to include all angles, θ, for 180≤θ<360 degrees. In such an embodiment, variations in the transitions of the Hall sensor signal may cause an incorrect half-phase determination at angles proximate to the transition angles of 0, 180 and 360 degrees. For example, if the incident magnetic field is positioned at 179 degrees, an error in the output of the Hall sensor could cause the detected angular position of the AMR-Hall system to be 359 degrees rather than 179 degrees. Thus, a system that includes a 180 degree AMR sensor and a single Hall sensor may not be able to produce accurate 360 degree angular sensing for angles proximate to the transitions between the half-phases of a 360 degree angular spectrum.

According to this disclosure, a magnetic field sensing device may include a 180 degree AMR sensor and two polarity detectors positioned in different locations with respect to each other. The polarity detectors may be differential Hall sensor pairs that are positioned in different orientations with respect to each other. The use of the differential Hall sensor pairs may provide for an output signal that is more robust with respect to misalignment of the sensors within the magnetic field. The use of two differential Hall sensor pairs may provide additional information regarding the half-phase in which the magnetic field is positioned. The additional information provided by a second differential Hall sensor pair may be use to prevent errors from occurring near the transition angles associated with the first Hall sensor pair. In this manner, a robust 360 degree angular position signal may be generated based on an AMR angular position sensing signal that has an angular range of 180 degrees.

FIG. 1 is a block diagram illustrating an embodiment of a magnetic field angular position sensing system 10. The magnetic field angular position sensing system 10 is configured to generate a signal 28 indicative of the angular position of magnetic field source 12. The magnetic field angular position sensing system 10 includes a magnetic field source 12 and a sensing subsystem 14. The magnetic field source 12 is magnetically coupled to sensing subsystem 14 via incident magnetic field 20.

The magnetic field source 12 is configured to generate an incident magnetic field 20. The magnetic field source 12 may be rotatable about an axis of rotation. As magnetic field source 12 rotates around the axis of rotation, the angular position of incident magnetic field 20 also rotates with respect to the sensing subsystem 14. Thus, the angular position of incident magnetic field 20 may be indicative of the angular position of magnetic field source 12. In particular, each angular position of incident magnetic field 20 may correspond to an angular position of magnetic field source 12. In some embodiments, the axis of rotation of incident magnetic field 20 may be the same axis of rotation as that of magnetic field source 12.

In some embodiments, magnetic field source 12 may be rotatably positioned at any angle within a 360 degree angular spectrum. In other words, in such embodiments, magnetic field source 12 may be able to rotate in a complete circle about the axis of rotation of magnetic field source 12. In such embodiments, incident magnetic field 20 may also rotate through a 360 degree angular spectrum.

Magnetic field source 12 may be formed from any type of magnetic source configured to generate incident magnetic field 20. In some embodiments, magnetic field source 12 may be a bar magnet, cylindrical magnet, ring magnet, or any other type of device configured to generate a magnetic field. In further embodiments, the incident magnetic field 20 generated by magnetic field source 12 may be of sufficient strength to saturate a magnetoresistive angular position sensor contained within sensing subsystem 14. In further embodiments, the strength of incident magnetic field 20 may be approximately equal to about 100 G or greater.

Sensing subsystem 14 is configured to receive incident magnetic field 20 and to generate a decoded angular position signal 28. In some embodiments, decoded angular position signal 28 may have an angular spectrum that is substantially equal to the angular spectrum of incident magnetic field 20. In further embodiments, decoded angular position signal 28 may have an angular spectrum equal to 360 degrees. In additional embodiments, decoded angular position signal 28 may vary with respect to incident magnetic field 20 according to a substantially linear function over a 360 degree spectrum. In other words, in such embodiments, the slope of a function having incident magnetic field 20 as the input value and decoded angular position signal 28 as the output value may be substantially constant for any angular position within a 360 degree spectrum.

Sensing subsystem 14 includes a sensing device 16 and a decoder device 18. Sensing device 16 is communicatively coupled to decoder device 18. Sensing device 16 is configured to sense incident magnetic field 20 and to generate an angular position signal 22, a first polarity signal 24 and a second polarity signal 26 based on sensed magnetic field 20. The three signals generated by the sensing device 16 may together be indicative of the angular position of incident magnetic field 20 within a 360 degree spectrum. While shown as three separate signals, the signals can be combined or otherwise transmitted to the decoder device 18.

In some embodiments, the angular position of incident magnetic field 20 may correspond to the angular position of components of incident magnetic field 20 that are parallel to a plane of sensitivity of sensing device 16. The plane of sensitivity may, in some embodiments, correspond to the plane of sensitivity of a magnetoresistive device contained within sensing device 16, e.g., the plane defined by a Wheatstone bridge configuration within the magnetoresistive device. In further embodiments, a fixed angle may be defined for sensing device 16 within the plane of sensitivity and the angular position of incident magnetic field 20 may be the angular position of incident magnetic field 20 relative to the fixed angle.

Sensing device 16 may generate angular position signal 22 such that angular position signal 22 varies with respect to incident magnetic field 20 according to a periodic function. For example, angular position signal 22 may vary with respect to incident magnetic field 20 according to a sinusoidal function. As used herein, a sinusoidal function may refer to a function that oscillates like a sine function or a cosine function with respect to the angular position of incident magnetic field 20. The sine function or cosine function may be shifted, stretched, compressed, squared, etc. The period of the periodic function, in some embodiments, may be equal to 180 degrees.

In some embodiments, angular position signal 22 may vary according to a $\cos^2(\theta)$ function where $\theta$ is the angular position of incident magnetic field 20. In further embodiments, angular position signal 22 may comprise two separate signals. The first signal may vary according to a $\sin(2\theta)$ relationship and the second signal may vary according to a $\cos(2\theta)$ relationship. The first signal and the second signal may together be indicative of the angular position of incident magnetic field 20 within a 180 degree range.

Each of the first polarity signal 24 and the second polarity signal 26 may be a signal that is capable of indicating a polarity of incident magnetic field 20 at a particular location of sensitivity. The polarity of the incident magnetic field 20 may, in some embodiments, refer to the polarity of a directional component of the incident magnetic field 20 at the location of sensitivity. The directional component may, for example, be a directional component that is substantially perpendicular to the plane of sensitivity of sensing device 16 at the location of sensitivity. The location of sensitivity for the first polarity signal 24 may be different from the location of sensitivity of the second polarity signal 26.

The first polarity signal 24 and the second polarity signal 26 may together provide quadrant information to the decoder device 18. In some embodiments, the quadrant information may be indicative of an approximate quadrant within a 360 angular spectrum in which the incident magnetic field 20 is positioned. In some embodiments, the quadrants may be overlapping quadrants. In further embodiments, the quadrant information may be indicative of a quadrant in which the incident magnetic field 20 is not positioned.

In some embodiments, one or both of the polarity signals 24, 26 and the decoded angular position signal 28 may be digital signals, e.g., a digital bit, indicative of the polarity of incident magnetic field 20. In further embodiments, one or both of the first polarity signal 24 and the second polarity signal 26 may be analog signals indicative of the polarity of incident magnetic field 20. When the polarity signals 24 and 26 are analog signals, a predetermined threshold together with the analog signal may together indicate the polarity of incident magnetic field 20. For example, an analog value of the first polarity signal 24 greater than a first threshold may be indicative of a first polarity and an analog signal less than or equal to the first threshold may be indicative of the second polarity.

The sensing device 16 may contain one or more magnetic field sensors configured to generate the angular position signal 22, the first polarity signal 24, and/or the second polarity signal 26. In some embodiments, the one or more magnetic field sensors may be affixed or attached to a common substrate.

The decoder device 18 can be configured to receive the angular position signal 22, the first polarity signal 24, and the second polarity signal 26 to generate the decoded angular position signal 28 based on the angular position signal 22, the first polarity signal 24, and the second polarity signal 26. The decoded angular position signal 28 may be a signal indicative of the angular position of the incident magnetic field 20 within a 360 degree spectrum.

The decoder device 18 may generate the decoded angular position signal 28 at least in part by implementing a two-input arctangent function based on the angular position signal 22, the first polarity signal 24, and the second polarity signal 26. In some embodiments, the decoder device 18 may implement a digital two-input arctangent function. In these embodiments, the decoder device 18 may be referred to herein as a digital decoder device 18. When implementing a digital two-input arctangent function, the decoder device 18 may use sequential circuit elements to implement the two-input arctangent function. As used herein, sequential circuit elements refer to circuit elements that retain a particular state after the inputs to the circuit elements are unasserted. For example, the decoder device 18 may use a look-up table stored within a memory or register bank to implement the two-input arctangent function.

In some embodiments, the decoder device 18 may implement an analog two-input arctangent function. In these embodiments, the decoder device 18 may be referred to herein as an analog decoder device 18. When implementing an analog two-input arctangent function, the decoder device 18 may use non-sequential circuit elements to implement the two-input arctangent function. As used herein, non-sequential circuit elements refer to circuit elements that do not retain a particular state after the inputs to the circuit elements are unasserted. For example, the decoder device 18 may use combinational circuit elements to implement the two-input arctangent function.

Figure 2:
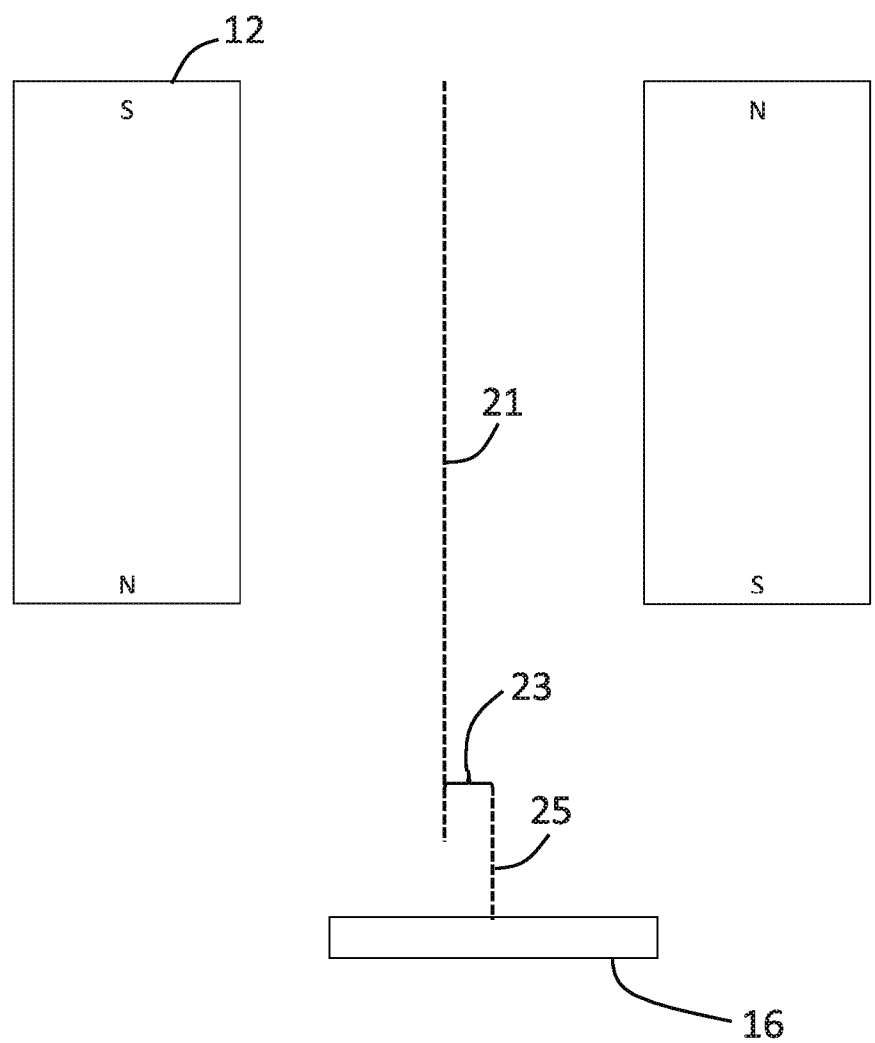
FIG. 2 is a side view of an embodiment of the magnetic field angular position sensing system.

FIG. 2 illustrates a side view of the magnetic field angular position sensing system 10 of FIG. 1. As shown the magnetic field source 12 is disposed in proximity to the sensing device 16. The magnetic field source 12 may be configured to rotate about axis 21, and/or the sensing device 16 may be configured to rotate about axis 25. In some embodiments, only one of the magnetic field source 12 or the sensing device 16 may rotate. If the magnetic field source 12 does not rotate, then the axis 21 can represent a centerline of the magnetic field source 12. If the sensing device 16 does not rotate, then the axis 25 can represent a centerline or vertex of the angular sensor component, as described in more detail herein. As illustrated, the two axes 21 and 25 may not align in all embodiments. The use of the differential polarity sensor pairs may provide a polarity measurement without the need for the axes 21 and 25 to perfectly align in every instance. A distance 23 between the two axis 21 and 25 can be defined. The use of differential polarity sensor pairs (e.g., differential Hall sensor pairs, etc.) may allow for the misalignment or distance between the two axes 21, 25 to be at least about 1 mm, at least about 2 mm, at least about 3 mm, at least about 4 mm, or at least about 5 mm. This degree of misalignment may not be achievable with the use of other types of polarity sensors.

Figure 3:
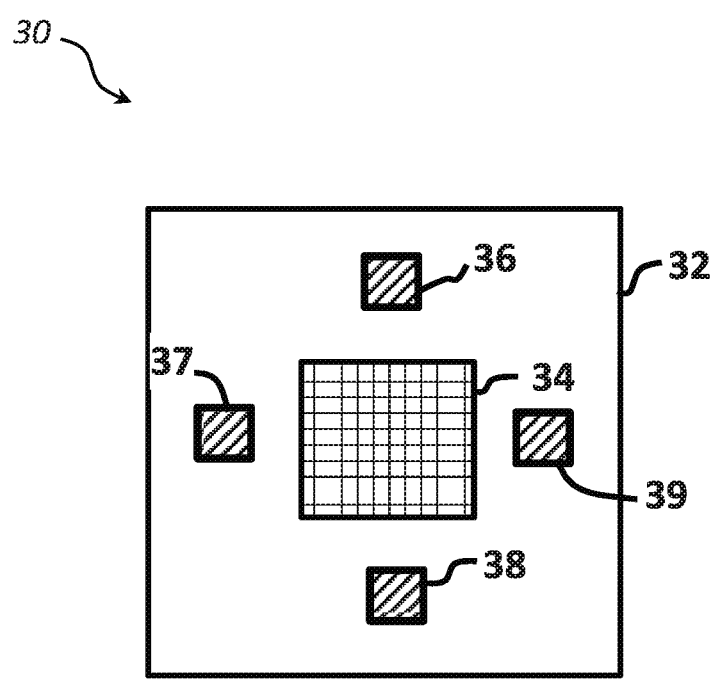
FIG. 3 is a top view of an embodiment of a sensing device according to this disclosure.

FIG. 3 is a top view of an embodiment of a sensing device 30 according to this disclosure. The sensing device 30 can be configured to generate the angular position signal 22, the first polarity signal 24, and the second polarity signal 26 based on an angular position of the incident magnetic field. In some embodiments, the sensing device 30 may correspond to the sensing device 16 of FIG. 1. The sensing device 30 can include the substrate 32, the angular position sensor 34, and a plurality of polarity detectors 36, 37, 38, and 39. One or more of the angular position sensor 34, the polarity detector 36, the polarity detector 37, the polarity detector 38, and the polarity detector 39 may be attached or affixed to substrate 32, and in some embodiments, one or more of the angular position sensor 34, the polarity detector 36, the polarity detector 37, the polarity detector 38, and the polarity detector 39 may be coplanar on the substrate 32.

The axes in FIG. 3 depict an x-axis extending from left to right and a y-axis extending from bottom to top. The circle with the dot in the center depicts that the z-axis extends out of the page toward the viewer.

Angular position sensor 34 is configured to sense the incident magnetic field 20 and to generate the angular position signal 22 based on the incident magnetic field 20. In some embodiments, the angular position sensor 34 may generate the angular position signal 22 such that the angular position signal 22 is indicative of the angular position of incident magnetic field 20 within a 180 degree measurement range. In some embodiments, the angular position sensor 34 may be a magnetoresistive sensor. The magnetoresistive sensor may include two Wheatstone bridge configurations oriented 45 degrees in rotation from each other.

In some examples, each Wheatstone bridge configuration may include four resistive elements, two bias nodes and two measurement nodes. A first resistive element may be electrically coupled between a first bias node and a first measurement node. A second resistive element may be electrically coupled between the first measurement node and a second bias node. A third resistive element may be electrically coupled between the first bias node and a second measurement node. A fourth resistive element may be electrically coupled between the second measurement node and the first bias node. In such a configuration, in order to generate the angular position signal 22, the angular position sensor 34 may apply a bias voltage between the first and second bias voltage nodes, and measure the resulting voltage across the first and second measurement nodes to produce a measured voltage.

One or more of the resistive elements within the Wheatstone bridge configuration may include magnetoresistive material. Magnetoresistive material may be a material having a property where the electrical resistance of the material changes when an external magnetic field is applied to the material, when the magnitude of the applied external magnetic field changes and/or when the direction of the external magnetic field changes. In some examples, the resistance of each of the resistive elements may vary according to a $\cos^2(\theta)$ relationship where $\theta$ is the angle between the magnetic moment vector of the resistive element and the current flow through the resistive element. For example, the magnetoresistive material may be formed from or include Permalloy material.

When two Wheatstone bridge configurations are oriented 45 degrees in rotation from each other, a first measured voltage received from the first Wheatstone bridge configuration may vary according to a first periodic function applied to the angular position of the incident magnetic field 20, and a second measured voltage received from the second Wheatstone bridge configuration may vary according to a second periodic function applied to the angular position of incident magnetic field 20. In some examples, the first and second periodic functions may each have a period of 180 degrees. In further examples, the first and second periodic functions may be sinusoidal functions. The first and second sinusoidal functions may be, in some examples, the same sinusoidal function, but the first sinusoidal function may be phase-shifted by 90 degrees with respect to the second sinusoidal function. In further examples, the first sinusoidal function may include a $\sin(2\theta)$ term where $\theta$ is the angle between incident magnetic field 20 and a fixed angle within the sensing plane of angular position sensor 34, and the second sinusoidal function may include a $\cos(2\theta)$ term where $\theta$ is the angle between incident magnetic field 20 and the fixed angle. In such examples, the first sinusoidal function and the second sinusoidal functions may include other scaling factors or constants in addition to the $\sin(2\theta)$ and $\cos(2\theta)$ terms. The first and second measured voltages may together be indicative of an angular position of incident magnetic field 20 within a 180 degree measurement range.

The example angular position sensor 34 described above is just one example of an angular position sensor 34 capable of being used with this disclosure. In further examples, angular position sensor 34 may take the form of an APS00B sensing chip available from Honeywell International, Inc. Other examples of magnetic field sensors capable of generating a signal indicative of a magnetic field may be used in place of angular position sensor 34 as will be apparent to a person of ordinary skill in the art.

As shown in the example sensing device 30 of FIG. 3, a plurality of differential Hall sensor pairs can be defined using the polarity detectors 36, 37, 38, and 39. In some embodiments, two differential Hall sensor pairs can be formed, where the first differential Hall sensor pair is defined by polarity detectors 37 and 39, and a second differential Hall sensor pair is defined by the polarity detector 36 and polarity detector 38. Each of the polarity detectors 36, 37, 38, and 39 are positioned in different locations around the angular position sensor 34. The first differential Hall sensor pair is configured to sense a differential incident magnetic field between the polarity detector 37 and the polarity detector 39 and generate a first polarity signal 24. Similarly, the second differential Hall sensor pair is configured to sense a differential incident magnetic field between the polarity sensor 36 and the polarity detector 38 and generate a second polarity signal 26. In some embodiments, the locations of the polarity sensors may be selected such that first different Hall sensor pair and the second differential Hall sensor pair can generate quadrant information indicating in which of a plurality of overlapping quadrants incident magnetic field 20 is positioned.

In some embodiments, each of the first and second differential Hall sensor pairs can comprise Hall sensors. In some embodiments, a Hall sensor may use the Hall or Lorentz force as a principle of operation. For example, such a sensor may include a semiconductor slab having two bias electrodes and two measurement electrodes. In some embodiments, the two bias electrodes may be positioned on sides of the slab opposite each other and the two measurement electrodes may be positioned on sides of the slab that are in between the sides of the slab where the bias electrodes are positioned. A bias current may be applied through the semiconductor slab between the bias electrodes, e.g., by applying a voltage between the bias electrodes of the slab. When an incident magnetic field applied to the slab, the Lorentz force causes the charge carriers to be deflected in a direction perpendicular to the direction of current flow and the applied magnetic field. The deflected charge carriers generate a voltage across the sides of the slab where the measurement electrodes are positioned that is sufficient to counteract the Lorentz force. The voltage across the measurement electrodes (i.e., the Hall voltage) may be indicative of the magnetic field strength of the applied magnetic field.

More specifically, the voltage across the measurement electrodes may be indicative of the strength of a directional component of the applied magnetic field. The directional component of the applied magnetic field may correspond to a directional component that is perpendicular to the direction of the applied current and the direction of the Lorentz force. In cases where the semiconductor substrate is substantially planar, the directional component of the applied magnetic field sensed by the Hall sensor may be the directional component that is perpendicular to the plane of the planar semiconductor substrate. The directional component indicated by the measured voltage may be referred to herein as the direction of sensitivity of the Hall sensor.

In some embodiments, the Hall sensor may output the measured voltage to generate an analog signal. The analog signal may be indicative of the polarity of a directional component of the applied magnetic field, e.g., the directional component that is parallel with the direction of sensitivity of the Hall sensor. For example, an analog measured voltage signal that is greater than zero may be indicative of a first polarity or direction of the directional component of the applied magnetic field. Similarly, an analog measured voltage signal that is less than or equal to zero may be indicative of a second polarity or direction of the directional component of the applied magnetic field.

The differential Hall sensor pair may be coupled and provide a differential output. In an embodiment, the output voltages of one Hall sensor in the differential Hall sensor pair can be subtracted from the output voltage of the other Hall sensor in the same differential Hall sensor pair. When both Hall sensors in the sensor pair are subjected to the same uniform field or in the absence of a field, the resulting differential may be substantially zero. The output may be non-zero when the incident magnetic field is changing to produce a differential between the two Hall sensors of the sensor pair. The resulting differential output in this instance represents the slope of magnetic field.

In some embodiments, the Hall sensor outputs may convert the analog measured voltage signal to a digital signal and output the digital signal. This can occur before or after the outputs from the sensors in the sensor pair are subtracted to provide the differential output. For example, each Hall sensor may include an analog-to-digital converter, such as, e.g., a comparator that compares the analog measured voltage value to a threshold voltage value and generates a digital output value based on the comparison. The threshold value may be, in some embodiments, equal to zero volts although other thresholds are possible. The digital signal may be indicative of the polarity of a directional component of the applied magnetic field. For example, the digital signal may include two digital states with a first digital state indicative of a first polarity or direction of the directional component of the applied magnetic field and a second digital state indicative of a second polarity or direction of the directional component of the applied magnetic field.

In some embodiments, one or more of the polarity detectors 36, 37, 38, and/or 39 may include a planar substrate. In such embodiments, the polarity detectors 36, 37, 38, and/or 39 may sense a directional component of incident magnetic field 20 that is perpendicular to the planar substrate of the polarity detectors 36, 37, 38, and/or 39, and generate polarity signal 24 such that polarity signal 24 is indicative of the polarity or direction of the sensed directional component of incident magnetic field 20.

The example Hall sensors described above is just one embodiment of the polarity detectors 36, 37, 38, and/or 39 capable of being used with this disclosure. In further embodiments, one or more of the polarity detectors 36, 37, 38, and/or 39 may take the form of an SS495A sensing chip available from Honeywell International, Inc. Other embodiments of magnetic field sensors capable of generating a signal indicative of a magnetic field may be used in place of polarity detectors 36, 37, 38, and/or 39 will be apparent to a person of ordinary skill in the art with the benefit of this disclosure.

Figure 4:
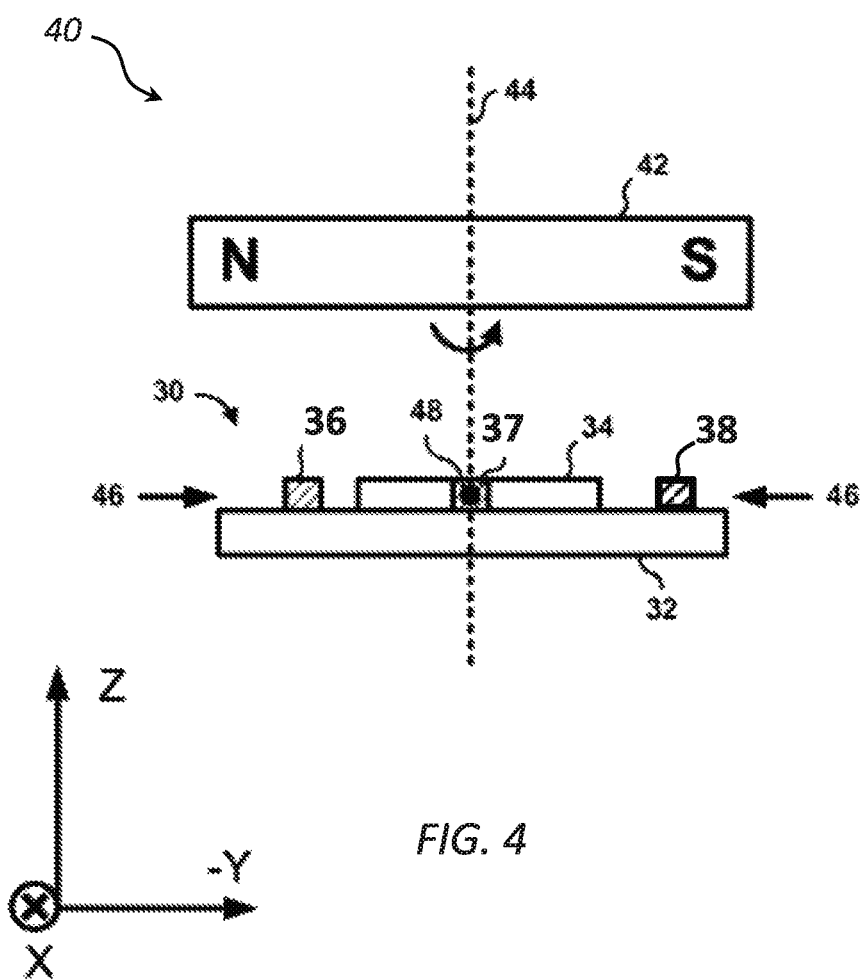
FIG. 4 is a conceptual diagram illustrating a side view of an embodiment of a sensing configuration according to this disclosure.

FIG. 4 is a conceptual diagram illustrating a side view 40 of an embodiment of a sensing configuration for the sensing device 30 of FIG. 3 according to this disclosure. In some embodiments, magnet 42 may correspond to magnetic field source 12 illustrated in FIG. 1. In further embodiments, sensing device 30 may correspond to sensing device 16 illustrated in FIG. 1.

The axes in FIG. 4 depict a y-axis extending in the negative direction from left to right and a z-axis extending in the positive direction from bottom to top. The circle with the "x" in the center depicts that the x-axis extends into the page away from the viewer.

One or more of magnet 42 and sensing device 30 may be configured to rotate about axis 44. In some embodiments, magnet 42 may be configured to rotate about axis 44, and sensing device 30 may be configured to remain stationary. In additional embodiments, sensing device 30 may be configured to rotate about axis 44, and magnet 42 may be configured to remain stationary. In further embodiments, magnet 42 and sensing device 30 may both be configured to rotate about axis 44. In each of these cases, magnet 42 may be said to rotate relative to sensing device 30, and the magnetic field generated by magnet 42 may be said to rotate relative to sensing device 30. The magnetic field generated by magnet 42 may correspond, in some embodiments, to incident magnetic field 20 illustrated in FIG. 1. As described above, the sensing device 30 may have an axis of rotation that is out of alignment with the axis 44. The use of the differential polarity sensor pairs may allow for some amount of misalignment of the two axes while still allowing the polarity to be detected.

Axis 44 may correspond to the axis of rotation of the magnetic field generated by magnet 42. The axis of rotation of the magnetic field generated by magnet 42 may alternatively be referred to as the axis of rotation of the magnetic field generated by magnet 42 relative to sensing device 30. In embodiments where magnet 42 rotates, the axis of rotation of the magnetic field may correspond to the axis of rotation of magnet 42. In embodiments where magnet 42 is stationary and sensing device 30 rotates, the axis of rotation of the magnetic field may correspond to the axis of rotation of sensing device 30. The axis of rotation of sensing device 30 may refer to the axis of rotation of substrate 32 and/or to the axis of rotation of a polarity detector sensing plane 46.

Polarity detector sensing plane 46 may be defined as a plane perpendicular to axis 44 that includes polarity detector 36 and polarity detector 38. In cases where polarity detector 36 and polarity detector 38 are Hall sensors, polarity detector sensing plane 46 may be referred to as a Hall sensor sensing plane 46.

As shown in the configuration of FIG. 4, the plane of sensitivity of angular position sensor 34 is substantially parallel to polarity detector sensing plane 46, and more particularly, polarity detector sensing plane 46 includes angular position sensor 34 in addition to polarity detector 36 and polarity detector 38. However, in other embodiments, angular position sensor 34 may not be included in polarity detector sensing plane 46 and/or the plane of sensitivity of angular position sensor 34 may not be parallel to polarity detector sensing plane 46.

As also shown in the configuration of FIG. 4, the direction of the magnetic dipole of magnet 42 is parallel to polarity detector sensing plane 46 and perpendicular to axis 44. The direction of the magnetic dipole of magnet 42 may be defined as a vector starting at the north pole of magnet 42 and extending toward the south pole of magnet 42. However, in other embodiments, the direction of the magnetic dipole magnet 42 may not be parallel to polarity detector sensing plane 46 and/or the direction of the magnetic dipole magnet 42 may not be perpendicular to axis 44.

Figure 5:
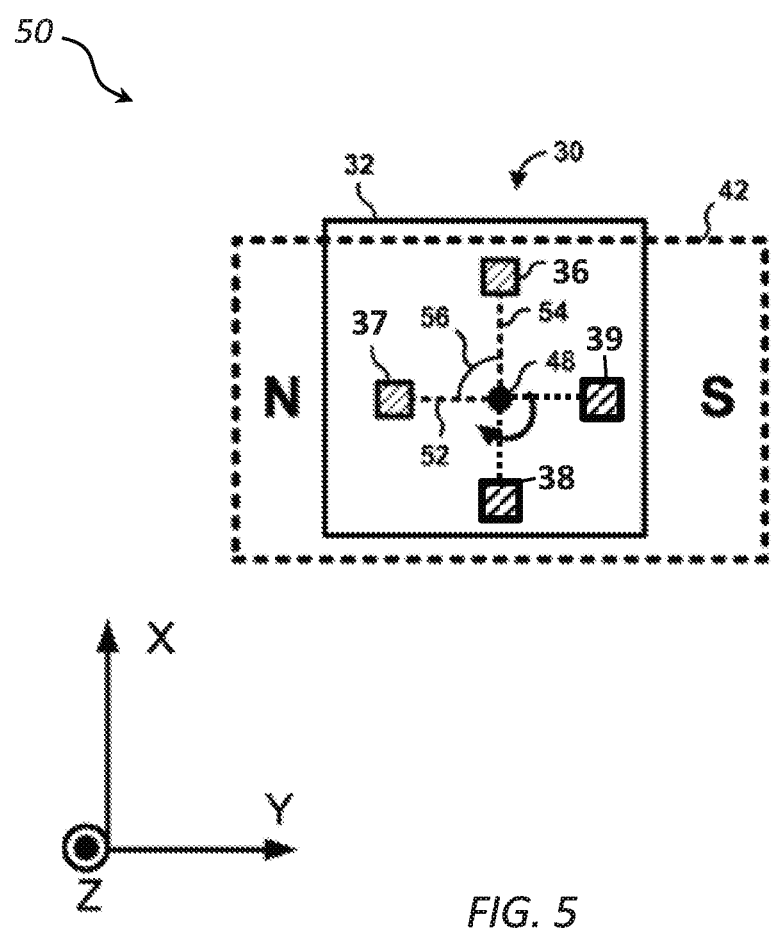
FIG. 5 is a conceptual diagram illustrating a top view of the embodiment of the sensing configuration of FIG. 2 according to this disclosure.

FIG. 5 is a conceptual diagram illustrating a top view 50 of the embodiment of the sensing configuration of FIG. 4 according to this disclosure. The axes in FIG. 5 are substantially similar to the axes in FIG. 3. Although sensing device 30 does include an angular position sensor 34, for ease of illustration of the concepts of FIG. 5, angular position sensor is not shown in FIG. 5.

Vertex 48 corresponds to vertex 48 shown in FIG. 4 and is defined at the location where the axis of rotation of the magnetic field intersects polarity detector sensing plane 46. As shown in FIG. 5, a line segment 52 may be defined between polarity detector 37 and polarity detector 39 that passes through vertex 48. A line segment 54 may be defined between polarity detector 36 and polarity detector 38 that passes through the vertex 48. The line segment 52 and line segment 54 may define an angle 56, where the vertex 48 is the vertex of the angle 56.

In some embodiments, the polarity detectors 36, 37, 38, and 39 may be positioned such that the measurement of angle 56 is within a range of approximately 70 degrees to approximately 110 degrees. In further embodiments, the polarity detectors 36, 37, 38, and 39 may be positioned such that the measurement of angle 56 is substantially equal to 90 degrees. When the polarity detectors 36, 37, 38, and 39 are positioned such that the measurement of angle 56 is substantially equal to 90 degrees, the polarity detectors 36, 37, 38, and 39 may be said to be positioned in a quadrature configuration with respect to an axis of rotation of the magnetic field.

Figure 6:
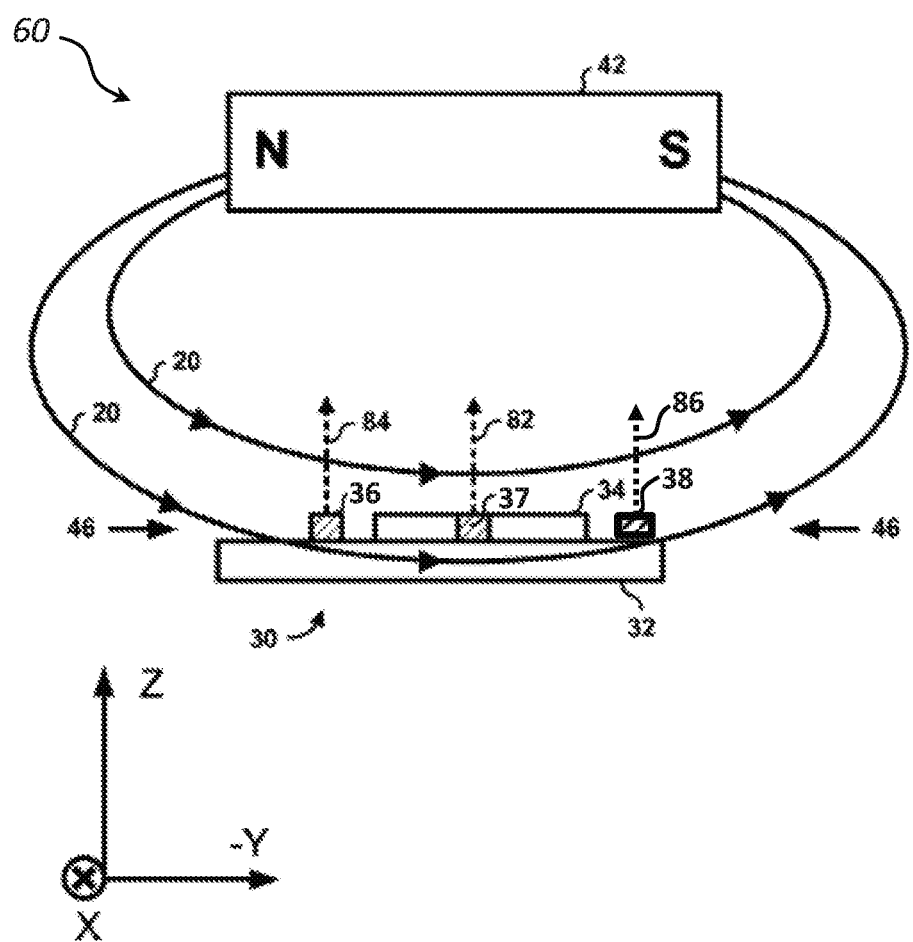
FIG. 6 is a conceptual diagram illustrating a side view of the magnetic field incident upon an embodiment of the sensing device.

FIG. 6 is a conceptual diagram illustrating a side view 60 of the magnetic field incident upon sensing device 30. As shown in FIG. 5, angular position sensor 34 has a plane of sensitivity that is parallel to Hall sensor sensing plane 46. Thus, angular position sensor 34 is configured to sense angular components of incident magnetic field 20 that are incident upon angular position sensor 34 and parallel to the polarity sensor sensing plane 46.

Each of the polarity detectors 36, 37, and 38 (where polarity detector 39 is not shown as it would be positioned behind the polarity detector 37) has a direction of sensitivity that is perpendicular to the polarity sensor sensing plane 46. Thus, polarity detector 36 is configured to sense directional components of incident magnetic field 20 from a first location that are perpendicular to the polarity sensor sensing plane 46 as represented by vector 84. Similarly, polarity detector 38 is configured to sense directional components of incident magnetic field 20 from a second location that are perpendicular to the polarity sensor sensing plane 46 as represented by vector 86. Further, polarity detector 37 is configured to sense directional components of incident magnetic field 20 from a third location that are perpendicular to the polarity sensor sensing plane 46 as represented by vector 82. Thus, in the embodiment shown in FIG. 6, polarity detectors 36, 37, and 38 are configured to sense directional components of incident magnetic field 20 that are perpendicular to the sensing plane of angular position sensor 34. The sensing plane of angular position sensor 34 may be defined as the plane occupied by and/or parallel the Wheatstone bridge configurations in angular position sensor 34. However, in other embodiments, the direction of sensitivity of one or more of the polarity detectors 36, 37, and 38 may not be perpendicular to the sensing plane of angular position sensor 34. The directional component of incident magnetic field 20 sensed by each of the polarity detectors 36, 37, and 38 may be referred to as the respective sensed directional component for the polarity detector.

When the polarity detector 36 detects the sensed directional components of incident magnetic field 20 as pointing in a first direction (e.g., a negative direction with respect the direction of sensitivity), then the polarity detector 36 generates a first logic value as the output value for the polarity detector 36. When the polarity detector 36 detects the sensed directional components as pointing in a second direction, (e.g., a positive direction with respect the direction of sensitivity), then the polarity detector 36 generates a second logic value as the output value for polarity detector 36. In some embodiments, an analog-to-digital converter, e.g., a comparator, may convert an analog magnitude of the sensed direction component into a digital logic value. The directional outputs of the polarity detector 37 and the polarity detector 38 may provide similar outputs. The resulting differential polarity sensor pair output can The polarity detector 36 may be said to operate in a transition state when the polarity detector 36 detects the sensed directional components to be approximately equal to zero or within a particular range proximate to zero referred to herein as a transition range. When not operating in the transition state, the polarity detector 36 may be said to operate in a negative sensing state when sensing negative sensed directional components and a positive sensing state when sensing positive sensed directional components. The polarity detectors 37 and 38 operates in a similar fashion to the polarity detector 36.

The output of each polarity detector in the differential polarity detector pair can be subtracted to provide the resulting output. For example, the output of the polarity detector 36 can be subtracted from the output of the polarity detector 38 to produce the differential polarity detector pair output, which can be used to generate a logic value. The choice of the subtraction order of the differential pair will produce the same result with a different sign, and the logic order of the subtraction can be selected to produce the desired logic value output.

As shown in FIG. 6, the directional component of the magnetic field incident upon polarity detector 38 that is parallel to the direction of sensitivity of the polarity detector 36 points in the negative direction. As such, the polarity detector 36 operates in a negative sensing state. The directional component of the magnetic field incident upon polarity detector 38 that is parallel to the direction of sensitivity of the polarity detector 38 points in the positive direction. As such, the polarity detector 38 operates in a positive sensing state. The differential polarity sensor output can then be described by the negative output of polarity detector 36 being subtracted from the positive output of the polarity detector 38, which can produce a positive output. The resulting positive output represents the slope of the differential magnetic field across the sensor 30, and the positive output can be converted to a positive logic value.

The magnetic field incident upon polarity detector 37 is approximately perpendicular to the direction of sensitivity of polarity detector 37. Thus, directional component of the magnetic field incident upon polarity detector 37 is approximately equal to zero, and the polarity detector 37 therefore operates in a transition state. While not illustrated, polarity detector 39 may similarly operate in the transition state, and the resulting differential polarity detector pair output may be approximately zero.

Figure 7:
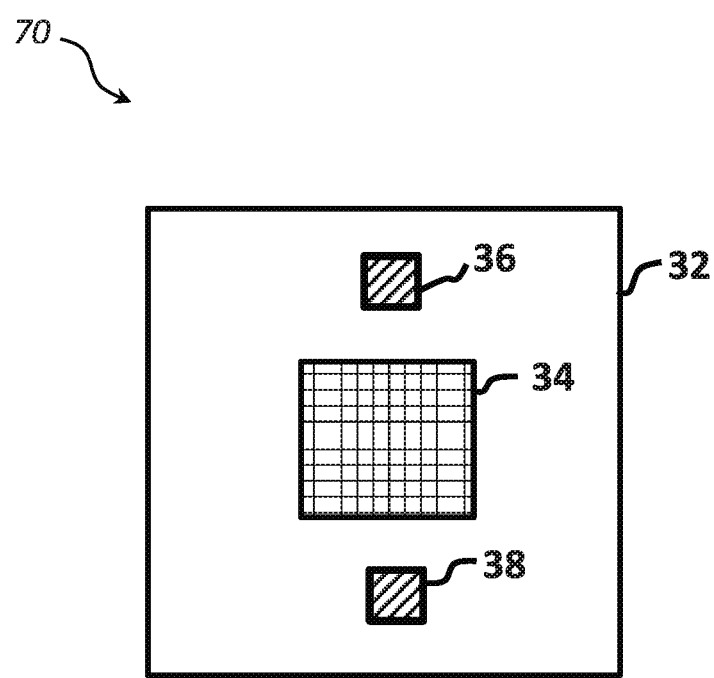
FIG. 7 is a top view of another embodiment of a sensing device according to this disclosure.

FIG. 7 is a top view of an example sensing device 70 according to an embodiment. The sensing device 70 can be configured to generate the angular position signal 22 and the first polarity signal 24 based on an angular position of the incident magnetic field. In some embodiments, the sensing device 70 may correspond to the sensing device 16 of FIG. 1. The sensing device 70 may be similar to the sensing device 30 described above with respect to FIGS. 3-6, only a single differential polarity sensor pair may be used to determine the first polarity signal 24, which may correspond to a half cycle sensing. The sensing device 70 can include the substrate 32, the angular position sensor 34 and polarity detectors 36 and 38, and the components may be the same or similar to those described above with respect to FIG. 3. One or more of angular position sensor 34, polarity detector 36 and polarity detector 38 may be attached or affixed to substrate 32.

As noted above, a single Hall sensor can be used to provide polarity information, though some errors can occur near the transition positions. As shown in FIG. 7, the differential polarity sensor pair can be used to reduce the potential error in the polarity determination. In this embodiment, a first differential polarity sensor pair is defined by polarity detectors 36 and 38. Each of the polarity detectors 36 and 38 can be positioned in different locations about the angular position sensor 34. The first differential polarity sensor pair is configured to sense a differential incident magnetic field between the polarity detector 36 and the polarity detector 36 and generate a first polarity signal 24. In some embodiments, the locations of the polarity detectors 36 and 38 may be selected such that first different polarity sensor pair can generate information indicating in which of a plurality of overlapping half-phases of the incident magnetic field 20 the sensors are positioned. The first polarity signal 24 may then include the slope of the magnetic field across the sensing device 70, which can be used to generate the angular position and half-phase of the 360 degree angular spectrum.

Figure 8:
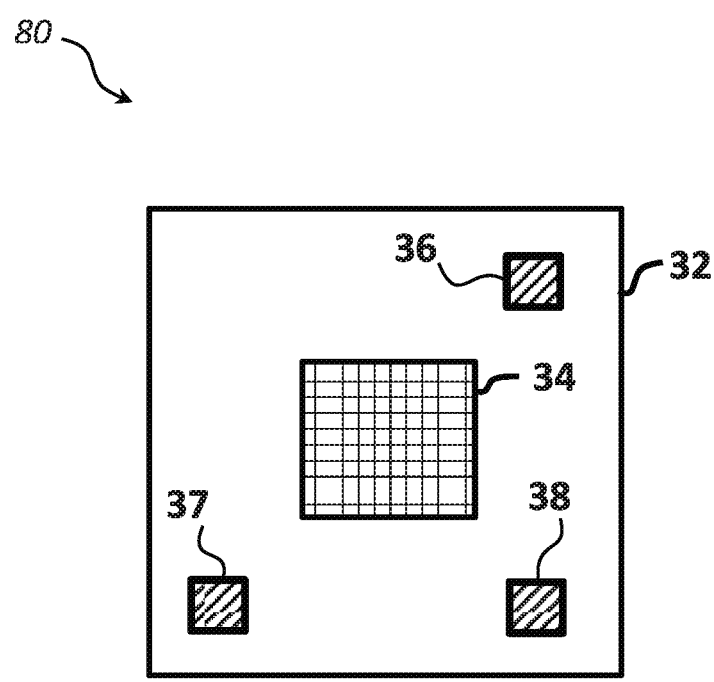
FIG. 8 is a top view of still another embodiment of a sensing device according to this disclosure.

FIG. 8 illustrates still another top view of an example sensing device 80 according to this disclosure. The sensing device 80 can be configured to generate the angular position signal 22, the first polarity signal 24, and the second polarity signal 26 based on an angular position of the incident magnetic field. In some embodiments, the sensing device 80 may correspond to the sensing device 16 of FIG. 1. The sensing device 80 may be similar to the sensing device 30 described above with respect to FIGS. 3-6 and the similar components will not be described in detail in this section in the interest of brevity. In this embodiment, only three polarity sensors are needed to create a plurality of differential polarity sensor pairs. The sensing device 80 can include the substrate 32, the angular position sensor 34, and a plurality of polarity detectors 36, 37, and 38. One or more of the angular position sensor 34, the polarity detector 36, the polarity detector 37, and/or the polarity detector 38 may be attached or affixed to the substrate 32, and in some embodiments, one or more of the angular position sensor 34, the polarity detector 36, the polarity detector 37, and/or the polarity detector 38 may be coplanar on the substrate 32.

As shown in the embodiment of the sensing device 80 of FIG. 8, a plurality of differential polarity sensor pairs can be defined using the polarity detectors 36, 37, and 38. In some embodiments, two differential polarity sensor pairs can be formed, where the first differential polarity sensor pair is defined by polarity detectors 36 and 37, and a second differential polarity sensor pair is defined by the polarity detectors 37 and 38. Each of the polarity detectors 36, 37, and 38 can be positioned in different locations around the angular position sensor 34. The first differential polarity sensor pair can be configured to sense a differential incident magnetic field between the polarity detector 36 and the polarity detector 37 and generate a first polarity signal 24. Similarly, the second differential polarity sensor pair can be configured to sense a differential incident magnetic field between the polarity detector 37 and the polarity detector 38 and generate a second polarity signal 26. In some embodiments, the locations of the polarity sensors may be selected such that first different polarity sensor pair and the second differential polarity sensor pair can generate quadrant information indicating in which of a plurality of overlapping quadrants incident magnetic field 20 is positioned. In some embodiments, the polarity detectors 36, 37, and 38 can comprise Hall sensors, and the differential polarity sensor pairs can comprise differential Hall sensor pairs. Any of the configurations and orientations described with respect to FIGS. 3-6 can be used with the three polarity detectors 36, 37, 38 illustrated in FIG. 8, where the differential polarity sensor pairs use three polarity detectors 36, 37, 38 rather than four polarity sensors.

Figure 9:
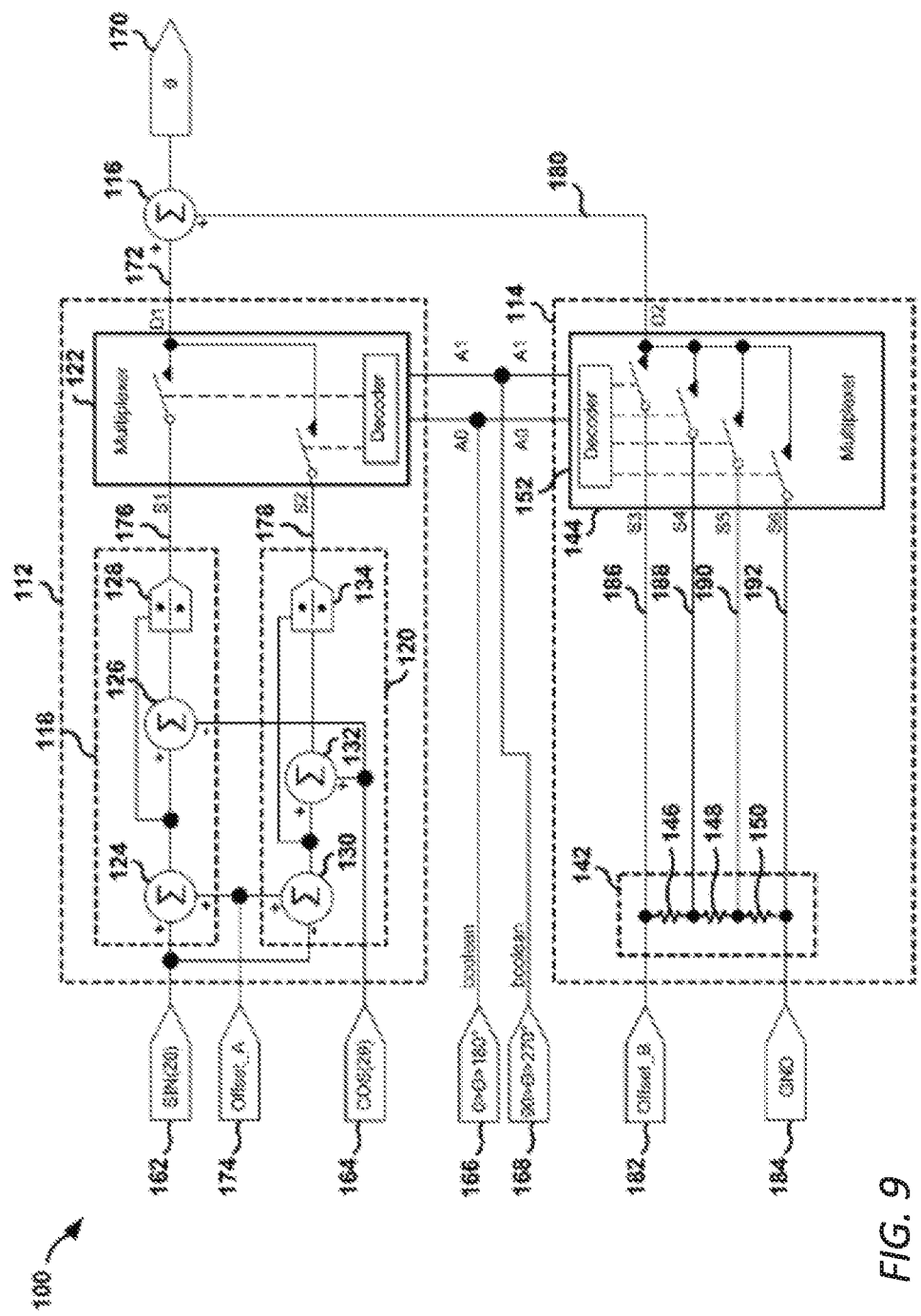
FIG. 9 is a schematic illustrating an embodiment of a decoder device according to this disclosure.

FIG. 9 is a schematic illustrating an example decoder device 100 according to this disclosure. Decoder device 100 is configured to generate a decoded angular position signal 170 based on angular position signals 162 and 164 and half-phase signals 166 and 168. In some embodiments, decoder device 100 may correspond to decoder device 18 illustrated in FIG. 1, angular position signals 162 and 164 may together correspond to angular position signal 22 shown in FIG. 1, half-phase signal 166 may correspond to the differential polarity signal 24 shown in FIG. 1, half-phase signal 168 may correspond to the differential polarity signal 26 shown in FIG. 1 and decoded angular position signal 170 may correspond to decoded angular position signal 28 shown in FIG. 1. Decoder device 100 includes an intermediate signal generator 112, an offset value generator 114 and a summation node 116.

Decoder device 100 is configured to generate decoded angular position signal 170 based on angular position signals 162 and 164 and half-phase signals 166 and 168. In some embodiments, angular positions signals 162 and 164 may vary sinusoidally with respect to the angular position of incident magnetic field 20, and decoder device 100 may be configured to generate output signal 170 such that decoded angular position signal 170 varies in a substantially linear fashion with respect to the of incident magnetic field 20. Decoder device 100 includes an intermediate signal generator 112, an offset value generator 114 and a summation node 116.

Intermediate signal generator 112 is configured to generate an intermediate signal 172 based on angular position signals 162 and 164 and half-phase signals 166 and 168. Intermediate signal generator 112 includes a first input terminal electrically coupled to angular position signal 162, a second input terminal electrically coupled to angular position signal 164, a third input terminal electrically coupled to half-phase signal 166, and a fourth input terminal electrically coupled to half-phase signal 168. In some embodiments, intermediate signal generator 112 may include a fifth input terminal electrically coupled to offset value 174. In other embodiments, offset value 174 may be produced internally within intermediate signal generator 112. In any case, intermediate signal generator 112 may generate intermediate signal 172 based on offset value 174 in addition to sinusoidal signals 162 and 164. In the embodiment of the decoder device 100 of FIG. 9, intermediate signal generator 112 includes transfer function circuits 118 and 120, and a candidate intermediate signal selector 122.

Angular position signal 162 and angular position signal 164 may be signals that are together indicative of the angular position of incident magnetic field 20. In some embodiments, the angular position of incident magnetic field 20 may be an angle within an angular spectrum, e.g., a 360 degree angular spectrum.

In some embodiments, angular position signal 162 may vary with respect to the angular position of incident magnetic field 20 according to a first sinusoidal function and angular position signal 164 may vary with respect to the angular position of incident magnetic field 20 according to a second sinusoidal function. As used herein, a sinusoidal function may refer to a function that oscillates like a sine function or a cosine function with respect to the angular position of incident magnetic field 20. The sine function or cosine function may be shifted, stretched and/or compressed. Each of the sinusoidal functions associated with angular position signal 162 and angular position signal 164 may have a period and a phase. A period, as used herein, may refer to the length of an interval of angular positions that contains one full cycle or repetition of the sinusoidal function. The phase, as used herein, may refer to where in the oscillation cycle a particular sinusoidal function begins.

In further embodiments, the period of the first sinusoidal function may be substantially equal to the period of the second sinusoidal function. In additional embodiments, the phase of the first sinusoidal function may be different from the phase of the second sinusoidal function. The type of sinusoidal function for the first sinusoidal function may, in some embodiments, be different from the type of sinusoidal function for the second sinusoidal function. For example, the first sinusoidal function may be a sine wave and the second sinusoidal function may be a cosine wave. It is recognized, however, that each of these different types of sinusoidal functions may be rewritten as the same type of sinusoidal function with an appropriate phase shift.

As shown in the specific embodiment of FIG. 9, angular position signal 162 varies with respect to an angular position, $\theta$, according to a $\sin 2\theta$ sinusoidal function, and angular position signal 164 varies with respect to the angular position, $\theta$, according to the $\cos 2\theta$ sinusoidal function. Thus, in the specific embodiment of FIG. 9, angular position signal 162 and angular position signal 164 vary with respect to $\theta$ according to sinusoidal functions that have substantially equal periods of 180 degrees. Because the $\cos 2\theta$ function is equivalent to a phase-shifted version of the $\sin 2\theta$ function, angular position signal 162 and angular position signal 164 may be said to vary with respect to $\theta$ according to sinusoidal functions that have different phases.

In the example configuration shown in FIG. 9, intermediate signal generator 112 includes a transfer function circuit 118, a transfer function circuit 120, and a candidate intermediate signal selector 122. Transfer function circuit 118 is configured to generate candidate intermediate signal 176 based on angular position signal 162, angular position signal 164 and offset value 174. In some embodiments, candidate intermediate signal 176 may vary with respect to the angular position of incident magnetic field 20 in a substantially linear fashion for one or more ranges or intervals of angular positions. In other words, for a particular interval of angular positions, as the angular position varies, candidate intermediate signal 176 may vary according to a function that has a substantially constant slope over the particular interval. In some implementations, the length of the interval of angular positions for which candidate intermediate signal 176 varies in a substantially linear fashion may be greater than the length of the interval of angular positions for which either of sinusoidal signals 162 and 164 approximates a linear function. For example, the length of the interval may be greater than or equal to 90 degrees.

Transfer function circuit 120 is configured to generate candidate intermediate signal 178 based on angular position signal 162, angular position signal 164 and offset value 174. Similar to candidate intermediate signal 176, candidate intermediate signal 178 may vary with respect to the angular position of incident magnetic field 20 in a substantially linear fashion for one or more ranges or intervals of angular positions. In some implementations, the length of the interval of angular positions for which candidate intermediate signal 178 varies in a substantially linear fashion may be greater than the length of the interval of angular positions for which either of sinusoidal signals 162 and 164 approximates a linear function. For example, the length of the interval may be greater than or equal to 90 degrees.

The one or more intervals of angular positions over which candidate intermediate signal 178 is substantially linear may be different from the one or more intervals over which candidate intermediate signal 176 is substantially linear. However, these intervals may be overlapping within one or more sub-intervals.

For the specific example decoder device 100 of FIG. 9, candidate intermediate signals 176 (S1) and 178 (S2) each vary linearly with respect to the angular position of incident magnetic field 20 for at least one-half of the period of angular position signals 162 and 164. More specifically, candidate intermediate signal 176 (S1) is substantially linear over a first interval of angular positions that includes angular positions within the range of 0 degrees to 90 degrees and a second interval of angular positions that includes angular positions within the range of 180 degrees to 270 degrees. Meanwhile, candidate intermediate signal 178 (S2) is substantially linear over a first interval of angular positions that includes angular positions within the range of 90 degrees to 180 degrees and a second interval of angular positions that includes angular positions within the range of 270 degrees to 360 degrees. The intervals of angular positions over which candidate intermediate signal 176 (S1) and candidate intermediate signal 178 (S2) are substantially linear may also include angular positions that extend outside of the ranges identified above in either direction.

The transfer function circuit 118 performs one or more arithmetic operations to generate candidate intermediate signal 176. The one or more arithmetic operations may include operations, such as, e.g., addition, subtraction, multiplication and/or division. In the example transfer function circuit 118 of FIG. 8, transfer function circuit 118 generates candidate intermediate signal 176 according to the following transfer function:

$$S1 = \frac{\sin 2\theta - \cos 2\theta + \text{off}}{\sin 2\theta + \text{off}} \quad \text{(Eq. 1)}$$

where S1 corresponds to candidate intermediate signal 176, θ corresponds to the angular position of incident magnetic field 20, sin 2θ corresponds to angular position signal 162, cos 2θ corresponds to angular position signal 164, and "off" corresponds to offset value 174.

The transfer function circuit 120 performs one or more arithmetic operations to generate candidate intermediate signal 178. The set of arithmetic operations performed by transfer function circuit 120 may be different than the set of arithmetic operations performed by transfer function circuit 118. In the particular embodiment of FIG. 8, transfer function circuit 120 generates candidate intermediate signal 178 according to the following transfer function:

$$S2 = \frac{\cos 2\theta - \sin 2\theta + \text{off}}{-\sin 2\theta + \text{off}} \quad \text{(Eq. 2)}$$

where S2 corresponds to candidate intermediate signal 178, θ corresponds to the angular position of incident magnetic field 20, sin 2θ corresponds to angular position signal 162, cos 2θ corresponds to angular position signal 164, and off corresponds to offset value 174.

In some embodiments, offset value 174 may be substantially constant, e.g., offset value 174 may be a substantially constant voltage. Offset value 174 may be selected such that S1 and S2 both include linear regions that are greater than or equal to 90 degrees. For example, offset value 174 may be within the range of approximately 1 to approximately 10 times the amplitude of one or both of sinusoidal signals 162 and 164. In some embodiments, offset value 174 may be substantially equal to 1.6 times the amplitude of one or both of sinusoidal signals 162 and 164 in order to provide candidate intermediate signals 176 and 178 that have a high degree of linearity. Other values for offset value 174, however, may be selected to adjust the slope and/or linearity of candidate intermediate signals 176 and 178. In additional embodiments, offset value 174 and offset voltage 182 may be selected such that the product of offset voltage 182 divided by 3 and offset value 174 is approximately equal to 2 times the amplitude of sinusoidal signals 162 and 164 in order to provide an output signal 170 with a high degree of linearity. In such embodiments, offset value 174 may be adjusted to control the value of offset voltage 182 needed to maintain the product of approximately 2 times the amplitude of the sinusoidal signals 162 and 164.

Transfer functions (1) and (2) represent angular position signal 162 and angular position signal 164 as sinusoidal functions with respect to the angular position of incident magnetic field 20. These transfer functions may be rewritten without the angular position parameter to better illustrate the operations that may be implemented by transfer function circuit 118 and transfer function circuit 120. For example, transfer function circuit 118 may be configured to generate candidate intermediate signal 176 according to the following transfer function:

$$S1 = \frac{A - B + \text{off}}{A + \text{off}} \quad \text{(Eq. 3)}$$

where S1 corresponds to candidate intermediate signal 176, A corresponds to angular position signal 162, B corresponds to angular position signal 164, and Off corresponds to offset value 174. Similarly, transfer function circuit 120 may be configured to generate candidate intermediate signal 178 according to the following transfer function:

$$S2 = \frac{B - A + \text{off}}{-A + \text{off}} \quad \text{(Eq. 4)}$$

where S2 corresponds to candidate intermediate signal 178, A corresponds to angular position signal 162, B corresponds to angular position signal 164, and Off corresponds to offset value 174.

In the embodiment of the decoder 100 of FIG. 9, the transfer function circuit 118 includes the summation unit 124, the subtraction unit 126 and the divider unit 128, and the transfer function circuit 120 includes the subtraction unit 130, the summation unit 132 and the divider unit 134. The summation units 124 and 132 are each configured to add two input values to produce an output value that is equal to the sum of the two input values. The subtraction units 126 and 130 are each configured to subtract a second input value from a first input value to produce an output value that is equal to the difference between the two input values.

The summation unit 124 includes a first addend input terminal electrically coupled to angular position signal 162, a second addend input terminal electrically coupled to offset value 174, and an output terminal. Subtraction unit 126 includes a minuend input terminal electrically coupled to the output terminal of summation unit 124, a subtrahend input terminal electrically coupled to angular position signal 164, and an output terminal. Subtraction unit 130 includes a minuend input terminal electrically coupled to offset value 174, a subtrahend input terminal electrically coupled to angular position signal 162, and an output terminal. Summation unit 132 includes a first addend input terminal electrically coupled to the output terminal of subtraction unit 130, a second addend terminal electrically coupled to angular position signal 164, and an output terminal.

Divider unit 128 and subtraction unit 130 are each configured to divide a first input value by a second input value to produce an output value that is equal to the quotient of the first input value divided by the second input value. Divider unit 128 includes a dividend input terminal electrically coupled to the output terminal of subtraction unit 126, a divisor input terminal electrically coupled to the output terminal of summation unit 124, and an output terminal electrically coupled to candidate intermediate signal selector 122. Divider unit 134 includes a dividend input terminal electrically coupled to the output terminal of summation unit 132, a divisor input terminal electrically coupled to the output terminal of subtraction unit 132, and an output terminal electrically coupled to candidate intermediate signal selector 122. The output terminal of divider unit 128 may form the output terminal of transfer function circuit 118 that outputs candidate intermediate signal 176, and the output terminal of divider unit 134 may form the output terminal of transfer function circuit 120 that outputs candidate intermediate signal 178.

Half-phase signal 166 may be a signal that is indicative of a half-phase occupied by the angular position of incident magnetic field 20 within a first half-phase partition. Half-phase signal 168 may be a signal that is indicative of a half-phase occupied by the angular position of incident magnetic field 20 within a second half-phase partition. As used herein, a half-phase may refer to a sub-interval of an interval of angular positions spanning one period of one or both of angular position signal 162 and angular position signal 164. For example, an interval of angular positions spanning one period of angular position signal 162 and/or angular position signal 164 may be sub-divided or partitioned into two sub-intervals according to a half-phase partition. Each of these sub-intervals may be referred to as a half-phase within the half-phase partition.

In some embodiments, one or both of half-phase signal 166 and half-phase signal 168 may be a digital signal that takes on one of two different binary logic values. In other embodiments, one or both of half-phase signal 166 and half-phase signal 168 may be an analog signal, and decoder device 100 may use a comparator or other analog-to-digital converter to generate a digital signal indicative of the half-phase occupied by the angular position of incident magnetic field 20. Half-phase signal 166 and half-phase signal 168 may be generated by one or more components external to decoder device 100. For example, one or more analog or digital differential Hall sensor pairs may be used to generate half-phase signal 166 and/or half-phase signal 168.

In the specific embodiment of FIG. 9, a first half-phase partition may be defined to include a first half-phase that corresponds to angular positions, θ, where 0°≤θ≤180°, and a second half-phase that corresponds to angular positions, θ, where 180°<θ≤360°. A second half-phase partition may be defined to include a first half-phase that corresponds to angular positions, θ, where 90°≤θ≤270° and a second half-phase that corresponds to angular positions, θ, where 0°<θ≤90° or 270°<θ≤360°. In other embodiments, however, the half-phases may be partitioned differently and the transitions between the half-phase may occur at different angular positions. In addition, although the half-phases used for the embodiment of FIG. 9 are equal in length, i.e., 180 degrees, the half-phases need not necessarily be equal in length.

The combination of half-phase information provided by half-phase signals 166 and 168 may be referred to herein as quadrant information. A first quadrant may be defined to correspond to angular positions, θ, where 0°≤θ≤90°, a second quadrant may be defined to correspond to angular positions, θ, where 90°≤θ≤180°, a third quadrant may be defined to correspond to angular positions, θ, where 180°≤θ≤270°, and a fourth quadrant may be defined to correspond to angular positions, θ, where 270°≤θ≤360°. In other embodiments, however, the quadrants may be partitioned differently and the quadrant transitions may occur at different angular positions. In addition, although the quadrants used for the embodiment of FIG. 8 are equal in length, i.e., 90 degrees, the quadrants need not necessarily be equal in length.

Candidate intermediate signal selector 122 is configured to select one of candidate intermediate signal 176 and candidate intermediate signal 178 to output as intermediate signal 172 based on half-phase signal 166 and half-phase signal 168. In the embodiment of FIG. 9, candidate intermediate signal selector 122 selects candidate intermediate signal 176 to output as intermediate signal 172 if half-phase signal 166 is equal to half-phase signal 168, and candidate intermediate signal selector 122 selects candidate intermediate signal 178 to output as intermediate signal 172 if half-phase signal 166 is not equal to half-phase signal 168. Candidate intermediate signal selector 122 includes a first input terminal electrically coupled to the output terminal of transfer function circuit 118, a second input terminal electrically coupled to the output terminal of transfer function circuit 120, a first control terminal electrically coupled to half-phase signal 166, a second control terminal electrically coupled to half-phase signal 168, and an output terminal that may form the output terminal of intermediate signal generator 112 that outputs intermediate signal 172.

Candidate intermediate signal selector 122 includes decoder and switches and. Decoder may control switches and to direct one of candidate intermediate signal 176 or candidate intermediate signal 178 to the output terminal of candidate intermediate signal selector 122 based on half-phase signal 166 and half-phase signal 168. For example, decoder may close switch and open switch if half-phase signal 166 is equal to half-phase signal 168, and open switch and close switch if half-phase signal 166 is not equal to half-phase signal 168.

Offset value generator 114 is configured to generate an offset value 180 based on half-phase signal 166 and half-phase signal 168. Offset value generator 114 includes a first control terminal electrically coupled to half-phase signal 166, and a second control terminal electrically coupled to half-phase signal 168. In some embodiments, intermediate signal generator 112 may include one or both of an input terminal electrically coupled to offset voltage 182 and an input terminal electrically coupled to ground voltage 184. In other embodiments, one or both of offset voltage 182 and ground voltage 184 may be produced internally within offset value generator 114. Offset value generator 114 includes a candidate offset value generator 142 and a offset value selector 144.

Candidate offset value generator 142 is configured to generate candidate offset values 186, 188, 190 and 192 based on offset voltage 182 and ground voltage 184. Candidate offset value generator 142 includes a first input terminal electrically coupled to offset voltage 182, a second input terminal electrically coupled to ground voltage 184, and four output terminals each electrically coupled to offset value selector 144. Candidate offset value generator 142 also includes resistances 146, 148 and 150. In some embodiments, resistances 146, 148 and 150 may have equal resistance values. A first terminal of resistance 146 is electrically coupled to offset voltage 182, and a first output terminal of candidate offset value generator 142. A second terminal of resistance 146 is electrically coupled to a first terminal of resistance 148, and a second output terminal of candidate offset value generator 142. The first terminal of resistance 148 is electrically coupled to the second terminal of resistance 146, and to the second output terminal of candidate offset value generator 142. A second terminal of resistance 148 is electrically coupled to a first terminal of resistance 150, and a third output terminal of candidate offset value generator 142. The first terminal of resistance 150 is electrically coupled to the second terminal of resistance 148, and to the third output terminal of candidate offset value generator 142. A second terminal of resistance 150 is electrically coupled to ground voltage 184, and to a fourth output terminal of candidate offset value generator 142.

In some embodiments, offset voltage 182 may be substantially constant. The value of offset voltage 182 may be based on the distance at which the linear regions of S1 and S2 are offset from each other. For example, offset voltage 182 may be within the range of approximately 0.2 to approximately 2 times the amplitude of one or both of sinusoidal signals 162 and 164. In some embodiments, offset value 174 and offset voltage 182 may be selected such that the product of offset value 174 and one third of offset voltage 182 is approximately equal to 2 times the amplitude of the sinusoidal signals 162 and 164 in order to provide an output signal 170 with a high degree of linearity. In further embodiments, the value of offset voltage 182 may be selected such that the value of offset voltage 182 is approximately equal to 3.75 times the amplitude of one or both of sinusoidal signals 162 and 164 when offset value 174 is set to 1.6 times one or both of sinusoidal signals 162 and 164. Ground voltage 184 may be substantially equal to zero volts.

Offset value selector 144 is configured to generate an offset value 180 based on half-phase signal 166 and half-phase signal 168. For example, offset value selector 144 may select one of candidate offset value 186, candidate offset value 188, candidate offset value 190 and candidate offset value 192 to output as offset value 180 based on half-phase signal 166 and half-phase signal 168. In the embodiment of FIG. 9, offset value selector 144 selects candidate offset value 186 to output as offset value 180 when half-phase signal 166 is equal to a logic one value and half-phase signal 168 is equal to a logic zero value, candidate offset value 188 to output as offset value 180 when half-phase signal 166 is equal to a logic one value and half-phase signal 168 is equal to a logic one value, candidate offset value 190 to output as offset value 180 when half-phase signal 166 is equal to a logic zero value and half-phase signal 168 is equal to a logic one value, candidate offset value 192 to output as offset value 180 when half-phase signal 166 is equal to a logic zero value and half-phase signal 168 is equal to a logic zero value. Offset value selector 144 includes four input terminal each electrically coupled to a respective output terminal of candidate offset value generator 142. Offset value selector 144 also includes an output terminal that may form the output terminal of offset value generator 114 that outputs offset value 180. Offset value selector 144 includes decoder 152, and switches. Decoder 152 may control switches to direct one of candidate offset value 186, candidate offset value 188, candidate offset value 190 and candidate offset value 192 to the output terminal of offset value selector 144 based on half-phase signal 166 and half-phase signal 168.

Summation node 116 is configured to add offset value 180 to intermediate signal 172 to produce decoded angular position signal 170. Summation node 116 includes a first addend input terminal electrically coupled to an output terminal of intermediate signal generator 112, a second addend input terminal electrically coupled to an output terminal of offset value generator 114, and an output terminal. The output terminal of summation node 116 may form the output terminal of decoder device 100 that produces decoded angular position signal 170.

Figure 10:
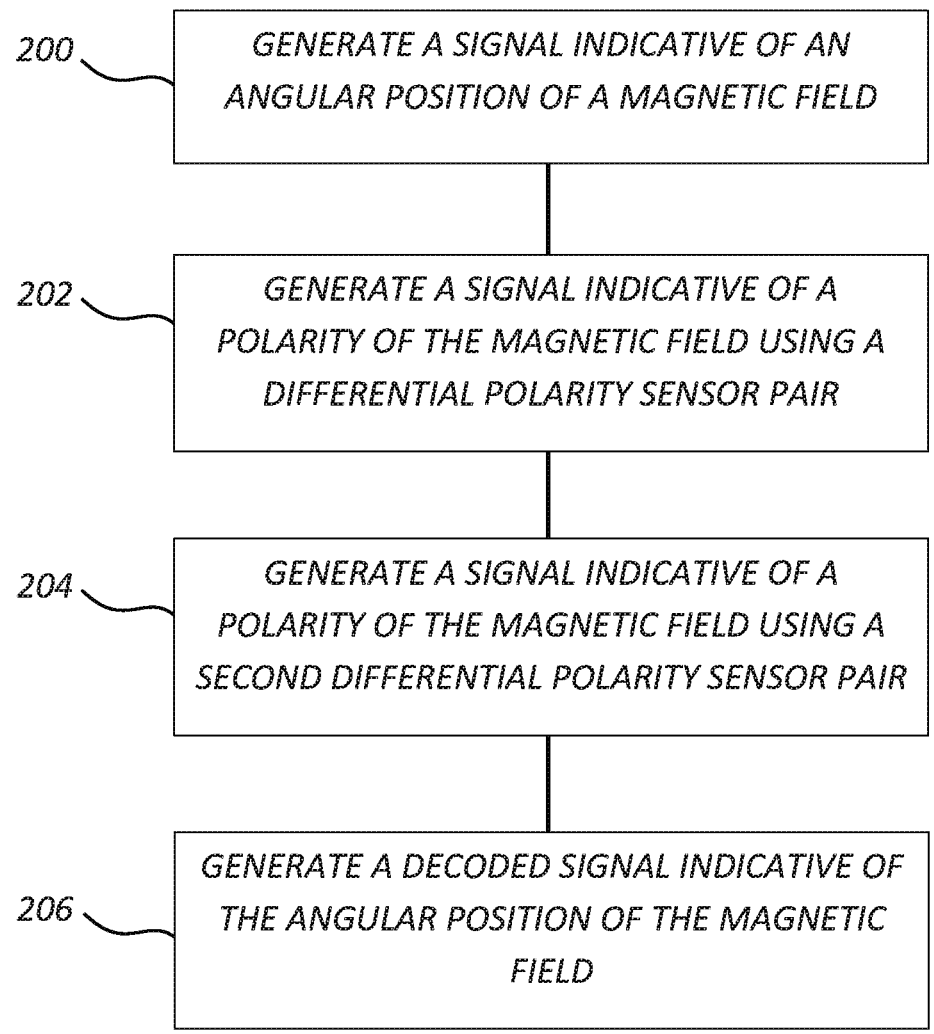
FIG. 10 is a flow diagram illustrating an embodiment of a technique for generating magnetic field angular position information according to this disclosure.

The operation of decoder device 100 will now be described with respect to FIGS. 9 and 10. FIG. 9 is a graph illustrating sinusoidal signals 162 and 164 and transfer function outputs generated by transfer function circuits 118 and 120 according to this disclosure. FIG. 10 is a graph illustrating how decoder device 100 generates decoded angular position signal 170 based on intermediate signal 172 and offset value 180 according to this disclosure.

Decoder device receives angular position signal 162, angular position signal 164, half-phase signal 166 and half-phase signal 168 from sensing device 16. Transfer function circuit 118 applies a first transfer function to the values of angular position signal 162 and angular position signal 164 to generate candidate intermediate signal 176 (S1). Similarly, transfer function circuit 120 applies a second transfer function to the values of angular position signal 162 and angular position signal 164 to generate candidate intermediate signal 178 (S2). Candidate intermediate signal selector 122 selects one of candidate intermediate signal 176 and candidate intermediate signal 178 to output as intermediate signal 172 based on half-phase signal 166 and half-phase signal 168.

A first quadrant may be defined to correspond to angular positions, θ, where 0°≤θ≤90°, a second quadrant may be defined to correspond to angular positions, θ, where 90°≤θ≤180°, a third quadrant may be defined to correspond to angular positions, θ, where 180°≤θ≤270°, and a fourth quadrant may be defined to correspond to angular positions, θ, where 270°≤θ≤360°. The candidate intermediate signal 176 is substantially linear in the first quadrant and the third quadrant, and the candidate intermediate signal 178 is substantially linear in the second quadrant and the fourth quadrant. As such, the quadrant information given to candidate intermediate signal selector 122 by half-phase signal 166 and half-phase signal 168 allows candidate intermediate signal selector 122 to select whichever of candidate intermediate signal 176 and candidate intermediate signal 178 is currently operating in a linear region. For example, when half-phase signal 166 and half-phase signal 168 indicate that angular position is either in the first or third quadrant, candidate intermediate signal selector 122 selects candidate intermediate signal 176 as intermediate signal 172. Similarly, when half-phase signal 166 and half-phase signal 168 indicate that the angular position is either in the second or fourth quadrant, candidate intermediate signal selector 122 selects candidate intermediate signal 178 as intermediate signal 172.

Meanwhile, candidate offset value generator 142 generates candidate offset values 186, 188, 190 and 192, and offset value selector 144 selects one of candidate offset values 186, 188, 190 and 192 as offset value 180 to add to intermediate signal 172. Summation node 116 adds offset value 180 to intermediate signal 172 to produce decoded angular position signal 170. Each value in decoded angular position signal 170 may map to a unique angular position within a period of sinusoidal signals 162 and 164. In this manner, decoder device 100 may implement a two-input arctangent function to decode two sinusoidal input signals without needing to use sequential memory elements or look-up tables.

In some embodiments, decoded angular position signal 170 may vary with respect to the angular position in a substantially linear fashion for at least the period of angular position signal 162 and/or angular position signal 164. In such embodiments, decoder 100 is able to provide a linear output that is indicative of the angular position without the need to use look-up tables.

In some embodiments, candidate intermediate signal 176 (S1) and candidate intermediate signal 178 (S2) may each be substantially linear within two different angular position intervals. The linear angular position intervals for candidate intermediate signal 176 may overlap with the linear angular position intervals for candidate intermediate signal 178 defining one or more overlap regions. Candidate intermediate signal 176 and candidate intermediate signal 178 may each be associated with two different offset values. For a given overlap region, the sum of candidate intermediate signal 176 and one of the offset values associated with candidate intermediate signal 176 may be substantially equal to the sum of candidate intermediate signal 178 and one of the offset values associated with candidate intermediate signal 178. Half-phase signal 166 and half-phase signal 168 may provide quadrant information indicative of a quadrant occupied by the angular position of incident magnetic field 20 and be used to select which of the two different candidate intermediate signals and associated offset values to use to generate the decoded output signal. Each transition between the four quadrants may be defined to occur within an interval of angular positions that defines a transition region. The set of angular positions that define a particular overlap region may encompass the set of angular positions that define a corresponding transition region. In other words, each angular position within a transition region may be included within the set of angular positions that define a corresponding overlap region. The transitions between quadrants, in some embodiments, may vary within a transition region due to an error tolerance within the sensors generating the signals indicative of the half-phases. By producing candidate intermediate signals and associated offset values that have substantially equal sums, decoder device 100 may be insensitive to variances in the transitions of half-phase signal 166 and half-phase signal 168 that are within the overlapping regions.

It should be noted that for angles proximate to the quadrant transition at 0 degrees and 360 degrees, two different outputs may occur. However, decoded angular position signal 170 may still be indicative of a unique angular position because each of these two signals can be mapped to a single angular position within a 360 degree interval. In addition, when decoded angular position signal 170 is said to vary with respect to the angular position in a substantially linear fashion over a full period of angular positions, e.g., 360 degrees, such a variance may include the understanding that angles proximate to the 0/360 degree quadrant transition may map to portions of decoded angular position signal 170 that extend beyond the maximum and minimum values for decoded angular position signal 170. Any of these outlier values may be mapped to a region within the 360 degree interval by applying a modulus operation followed by an offset operation to decoded angular position signal 170 with the modulus equal to the value of decoded angular position signal 170 at 360 degrees minus the value of decoded angular position signal 170 at zero degrees and the offset equal to the value of decoded angular position signal 170 at zero degrees.

FIG. 10 is a flow diagram illustrating an exemplary technique for generating magnetic field angular position information according to this disclosure. In some embodiments, the technique in FIG. 10 may be used in sensing device 16 of FIG. 1 and/or in sensing device 30 of FIG. 3.

Sensing device 16 and/or angle position sensor 34 generates a signal indicative of an angular position of a magnetic field having an angular range of 180 degrees (200). Sensing device 16 and/or differential polarity sensor pair can generate a signal indicative of a polarity of the magnetic field (202). The differential polarity sensor pair can comprise first and second Hall sensor elements, which may be referred to as a differential Hall sensor pair. Sensing device 16 and/or a second differential polarity sensor pair can generate a signal indicative of a polarity of the magnetic field (204). The differential polarity sensor pair can comprise third and fourth Hall sensor elements, which may be referred to as a second differential Hall sensor pair. In some embodiments, the two differential Hall sensor pairs can share a common element. For example, the second Hall sensor in the first differential Hall sensor pair can be the same as the third Hall sensor in the second differential hall sensor pair. The two differential Hall sensor pairs can be oriented at an angle of between about 70 degrees and 110 degrees, or in some embodiments, at about 90 degrees from each other.

The method can also include generating a decoded signal indicative of the angular position of the magnetic field based on the first signal indicative of the angular position of the magnetic field, the signal indicative of the polarity of the magnetic field, and the signal indicative of the polarity of the magnetic field (206). The decoded signal can have an angular range of 360 degrees.

The generation of the decoded signal can include a number of sub-steps. For example, an intermediate signal generator 112 can generate an intermediate value based on the first signal indicative of the angular position of the magnetic field, the signal indicative of the polarity of the magnetic field, and the second signal indicative of the polarity of the magnetic field. The offset value generator 114 can select an offset value from a set of offset values to add to the intermediate value based on at least one of the signal indicative of the polarity of the magnetic field and the second signal indicative of the polarity of the magnetic field. Summation node 116 adds the selected offset to the intermediate value to generate the decoded signal indicative of the angular position of the magnetic field.

Further, the transfer function unit 118 can apply a first transfer function to first and second signals indicative of the angular position of the magnetic field to produce a first candidate intermediate signal. The transfer function unit 120 applies a second transfer function to the first and second signals indicative of the angular position of the magnetic field to produce a second candidate intermediate signal. Candidate intermediate signal selector 122 can select one of the first and second candidate intermediate signals as the intermediate signal. The offset value selector 114 selects an offset value from a set of offset values. In some embodiments, the set of offset values may include at least two offset values. In further embodiments, the set of offset values may include at least four offset values. Summation node 116 adds the selected offset to the intermediate value to generate the decoded signal indicative of the angular position of the magnetic field.

Having described various systems and method herein, embodiments can include, but are not limited to:

In a first embodiment, a device comprises a magnetoresistive sensor configured to generate a signal indicative of an angular position of a magnetic field, the signal having an angular range of 180 degrees; and a differential Hall sensor pair comprising a first Hall sensor and a second Hall sensor, wherein the differential Hall sensor pair is configured to generate a signal indicative of a polarity of the magnetic field.

A second embodiment can include the device of the first embodiment, further comprising: a second differential Hall sensor pair, wherein the second differential Hall sensor pair is configured to generate a signal indicative of a polarity of the magnetic field.

A third embodiment can include the device of the second embodiment, wherein the second differential Hall sensor pair comprises at least one of the first Hall sensor or the second Hall sensor, and a third Hall sensor.

A fourth embodiment can include the device of the second embodiment, wherein the second differential Hall sensor pair comprises a third Hall sensor and a fourth Hall sensor.

A fifth embodiment can include the device of any of the second to fourth embodiments, wherein a Hall sensor sensing plane is defined as a plane that includes the differential Hall sensor pair and the second differential Hall sensor pair and is perpendicular to the axis of rotation of the magnetic field, and wherein the differential Hall sensor pair and the second differential Hall sensor pair are positioned such that a measurement of an angle formed between a first line connecting the sensors forming the differential Hall sensor pair and a second line connecting the sensors forming the second differential Hall sensor pair is approximately equal to 90 degrees.

A sixth embodiment can include the device of any of the first to fifth embodiments, wherein the device further comprises: a decoder configured to generate a decoded signal indicative of the angular position of the magnetic field based on the first signal indicative of the angular position of the magnetic field, and the signal indicative of the polarity of the magnetic field sensed by the differential Hall sensor pair, the decoded signal having an angular range of 360 degrees.

A seventh embodiment can include the device of the sixth embodiment, wherein the decoder comprises an analog decoder.

An eighth embodiment can include the device of any of the second to seventh embodiments, wherein the differential Hall sensor pair and the second differential Hall sensor pair are positioned in a quadrature configuration with respect to an axis of rotation of the magnetic field.

A ninth embodiment can include the device of any of the first to eighth embodiments, wherein the signal indicative of the angular position of the magnetic field comprises one or more signals that vary sinusoidally with respect to the angular position of the magnetic field.

A tenth embodiment can include the device of any of the first to ninth embodiments, wherein the magnetoresistive sensor, the first Hall sensor, and the second Hall sensor are each attached to a planar substrate, wherein the magnetoresistive sensor is configured to sense components of the magnetic field that are coplanar with the planar substrate, wherein the first Hall sensor is configured to sense components of the magnetic field that are perpendicular to the planar substrate, and wherein the second Hall sensor is configured to sense components of the magnetic field that are perpendicular to the planar substrate, and wherein the differential Hall sensor pair is configured to produce an output comprising the difference in an output of the first Hall sensor and the second Hall sensor.

In an eleventh embodiment, a method comprises generating, with a magnetoresistive sensor, a signal indicative of an angular position of a magnetic field, the signal having an angular range of 180 degrees; and generating a signal indicative of a polarity of the magnetic field using a differential Hall sensor pair, wherein the differential Hall sensor pair comprises a first Hall sensor and a second Hall sensor.

A twelfth embodiment can include the method of the eleventh embodiment, further comprising: generating a second signal indicative of a polarity of the magnetic field using a second differential Hall sensor pair, wherein the second differential Hall sensor pair comprises a third Hall sensor and a fourth Hall sensor.

A thirteenth embodiment can include the method of the twelfth embodiment, wherein the third Hall sensor is the same as the first Hall sensor or the second Hall sensor.

A fourteenth embodiment can include the method of the twelfth or thirteenth embodiment, further comprising: generating a decoded signal indicative of the angular position of the magnetic field based on the first signal indicative of the angular position of the magnetic field, the signal indicative of the polarity of the magnetic field, and the second signal indicative of the polarity of the magnetic field, the decoded signal having an angular range of 360 degrees.

A fifteenth embodiment can include the method of any of the twelfth to fourteenth embodiments, wherein the signal indicative of the angular position of a magnetic field comprises a first sinusoidal signal and a second sinusoidal signal, and wherein the method further comprises: applying a first transfer function to the first sinusoidal signal and the second sinusoidal signal to produce a first candidate intermediate signal; applying a second transfer function to the first sinusoidal signal and the second sinusoidal signal to produce a second candidate intermediate signal; selecting one of the first candidate intermediate signal and the second candidate intermediate signal as the intermediate signal based on the signal indicative of the polarity of the magnetic field and the second signal indicative of the polarity of the magnetic field; selecting an offset value from a set of offset values based on the signal indicative of the polarity of the magnetic field and the second signal indicative of the polarity of the magnetic field; and adding the selected offset to the intermediate value to generate the decoded signal indicative of the angular position of the magnetic field.

In a sixteenth embodiment, a device comprises a magnetoresistive sensor configured to generate a signal indicative of an angular position of a magnetic field, the signal having an angular range of 180 degrees; a first differential polarity sensor configured to generate a first signal indicative of a polarity of the magnetic field; and a second differential polarity sensor configured to generate a second signal indicative of a polarity of the magnetic field.

A seventeenth embodiment can include the device of the sixteenth embodiment, further comprising: a decoder configured to generate a decoded signal indicative of the angular position of the magnetic field based on the signal indicative of the angular position of the magnetic field, the first signal indicative of the polarity of the magnetic field, and the second signal indicative of the polarity of the magnetic field, the decoded signal having an angular range of 360 degrees.

An eighteenth embodiment can include the device of the sixteenth or seventeenth embodiment, wherein the first differential polarity sensor comprises a first Hall sensor and a second Hall sensor, wherein the second differential polarity sensor comprises a third Hall sensor and a fourth Hall sensor.

A nineteenth embodiment can include the device of the eighteenth embodiment, wherein the second Hall sensor and the third Hall sensor are the same sensor.

A twentieth embodiment can include the device of any of the sixteenth to nineteenth embodiments, wherein an axis of rotation of the magnetic field and an axis of rotation of the device are out of alignment.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as comprises, includes, and having should be understood to provide support for narrower terms such as consisting of, consisting essentially of, and comprised substantially of. Use of the term "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A device comprising:
a magnetoresistive sensor configured to generate a signal indicative of an angular position of a magnetic field, the signal having an angular range of 180 degrees;
a first differential Hall sensor pair comprising a first Hall sensor and a second Hall sensor, wherein the first differential Hall sensor pair is configured to generate a signal indicative of a polarity of the magnetic field, wherein each of the first Hall sensor and the second Hall sensor is configured to generate a signal indicative of a polarity of the magnetic field sensed from a first location and a second location respectively; and
a second differential Hall sensor pair comprising at least a third Hall sensor, wherein the second differential Hall sensor pair is configured to generate a signal indicative of a polarity of the magnetic field, and
wherein the third Hall sensor is configured to generate a signal indicative of a polarity of the magnetic field sensed from a third location.

2. The device of claim 1, wherein the second differential Hall sensor pair comprises at least one of the first Hall sensor or the second Hall sensor, and the third Hall sensor.

3. The device of claim 1, wherein the second differential Hall sensor pair comprises the third Hall sensor and a fourth Hall sensor.

4. The device of claim 3, wherein the magnetoresistive sensor, the third Hall sensor, and the fourth Hall sensor are each attached to a planar substrate, wherein the magnetoresistive sensor is configured to sense components of the magnetic field that are coplanar with the planar substrate,
wherein the third Hall sensor is configured to sense components of the magnetic field that are perpendicular to the planar substrate, and wherein the fourth Hall sensor is configured to sense components of the magnetic field that are perpendicular to the planar substrate, and
wherein the second differential Hall sensor pair is configured to produce an output comprising a difference in an output of the third Hall sensor and the fourth Hall sensor.

5. The device of claim 1,
wherein a Hall sensor sensing plane is defined as a plane that includes the first differential Hall sensor pair and the second differential Hall sensor pair and is perpendicular to an axis of rotation of the magnetic field, and
wherein the first differential Hall sensor pair and the second differential Hall sensor pair are positioned such that a measurement of an angle formed between a first line connecting the first and second Hall sensors forming the first differential Hall sensor pair and a second line connecting at least the third Hall sensor of the second differential Hall sensor pair is approximately equal to 90 degrees.

6. The device of claim 1, wherein the device further comprises a decoder configured to generate a decoded signal indicative of the angular position of the magnetic field based on the signal indicative of the angular position of the magnetic field, and the signal indicative of the polarity of the magnetic field sensed by the first differential Hall sensor pair, the decoded signal having an angular range of 360 degrees.

7. The device of claim 6, wherein the decoder comprises an analog decoder.

8. The device of claim 1, wherein the first differential Hall sensor pair and the second differential Hall sensor pair are positioned in a quadrature configuration with respect to an axis of rotation of the magnetic field.

9. The device of claim 1, wherein the signal indicative of the angular position of the magnetic field comprises one or more signals that vary sinusoidally with respect to the angular position of the magnetic field.

10. The device of claim 1, wherein the magnetoresistive sensor, the first Hall sensor, and the second Hall sensor are each attached to a planar substrate,
wherein the magnetoresistive sensor is configured to sense components of the magnetic field that are coplanar with the planar substrate, wherein the first Hall sensor is configured to sense components of the magnetic field that are perpendicular to the planar substrate, and
wherein the second Hall sensor is configured to sense components of the magnetic field that are perpendicular to the planar substrate, and wherein the first differential Hall sensor pair is configured to produce an output comprising a difference in an output of the first Hall sensor and the second Hall sensor.

11. A method comprising:
generating, with a magnetoresistive sensor, a signal indicative of an angular position of a magnetic field, the signal having an angular range of 180 degrees;
generating a first signal indicative of a polarity of the magnetic field using a first differential Hall sensor pair, wherein the first differential Hall sensor pair comprises a first Hall sensor and a second Hall sensor, wherein each of the first Hall sensor and the second Hall sensor is configured to generate a signal indicative of a polarity of the magnetic field sensed from a first location and a second location respectively; and
generating a second signal indicative of a polarity of the magnetic field using a second differential Hall sensor pair, wherein the second differential Hall sensor pair comprises a third Hall sensor, wherein the third Hall sensor is configured to generate a signal indicative of a polarity of the magnetic field sensed from a third location.

12. The method of claim 11, wherein the second differential Hall sensor pair comprises at least one of the first Hall sensor or the second Hall sensor, and the third Hall sensor.

13. The method of claim 11, wherein the second differential Hall sensor pair comprises the third Hall sensor and a fourth Hall sensor.

14. The method of claim 11, further comprising generating a decoded signal indicative of the angular position of the magnetic field based on the signal indicative of the angular position of the magnetic field, the first signal indicative of the polarity of the magnetic field, and the second signal indicative of the polarity of the magnetic field, the decoded signal having an angular range of 360 degrees.

15. The method of claim 11, wherein the signal indicative of the angular position of the magnetic field comprises a first sinusoidal signal and a second sinusoidal signal, and wherein the method further comprises:
applying a first transfer function to the first sinusoidal signal and the second sinusoidal signal to produce a first candidate intermediate signal;
applying a second transfer function to the first sinusoidal signal and the second sinusoidal signal to produce a second candidate intermediate signal;
selecting one of the first candidate intermediate signal and the second candidate intermediate signal as an intermediate signal based on the first signal indicative of the polarity of the magnetic field and the second signal indicative of the polarity of the magnetic field;
selecting an offset value from a set of offset values based on the first signal indicative of the polarity of the magnetic field and the second signal indicative of the polarity of the magnetic field; and
adding the selected offset to an intermediate value to generate a decoded signal indicative of the angular position of the magnetic field.

16. A device comprising:
a magnetoresistive sensor configured to generate a signal indicative of an angular position of a magnetic field, the signal having an angular range of 180 degrees;
a first differential polarity sensor configured to generate a first signal indicative of a polarity of the magnetic field, wherein the first differential polarity sensor comprises a first Hall sensor and a second Hall sensor, wherein each of the first Hall sensor and the second Hall sensor is configured to generate a signal indicative of a polarity of the magnetic field sensed from a first location and a second location respectively; and
a second differential polarity sensor configured to generate a second signal indicative of a polarity of the magnetic field, wherein the second differential polarity sensor comprises at least a third Hall sensor, wherein the third Hall sensor is configured to generate a signal indicative of a polarity of the magnetic field sensed from a third location.

17. The device of claim 16, further comprising a decoder configured to generate a decoded signal indicative of the angular position of the magnetic field based on the signal indicative of the angular position of the magnetic field, the first signal indicative of the polarity of the magnetic field, and the second signal indicative of the polarity of the magnetic field, the decoded signal having an angular range of 360 degrees.

18. The device of claim 16, wherein the second differential polarity sensor comprises the third Hall sensor and a fourth Hall sensor.

19. The device of claim 18, wherein the second differential polarity sensor comprises the third Hall sensor and one of the first Hall sensor or the second Hall sensor.

20. The device of claim 16, wherein an axis of rotation of the magnetic field and an axis of rotation of the device are out of alignment.

* * * * *